(12) United States Patent
Trautman et al.

(10) Patent No.: US 9,568,906 B2
(45) Date of Patent: Feb. 14, 2017

(54) ROBOTIC OBJECT COATING SYSTEM

(71) Applicant: The Boeing Company, Chicago, IL (US)

(72) Inventors: Peter F. Trautman, Seattle, WA (US); Hui Li, Seattle, WA (US)

(73) Assignee: THE BOEING COMPANY, Chicago, IL (US)

( * ) Notice: Subject to any disclaimer, the term of this patent is extended or adjusted under 35 U.S.C. 154(b) by 600 days.

(21) Appl. No.: 14/030,534

(22) Filed: Sep. 18, 2013

(65) Prior Publication Data
US 2015/0081073 A1 Mar. 19, 2015

(51) Int. Cl.
| G05B 19/042 | (2006.01) |
| B05C 11/00 | (2006.01) |
| G06F 17/50 | (2006.01) |
| B05B 12/12 | (2006.01) |
| B05B 13/04 | (2006.01) |

(52) U.S. Cl.
CPC ......... G05B 19/0426 (2013.01); B05B 12/122 (2013.01); B05B 13/0431 (2013.01); B05B 13/0457 (2013.01); B05C 11/00 (2013.01); G06F 17/50 (2013.01); Y02T 10/82 (2013.01); Y10S 901/43 (2013.01)

(58) Field of Classification Search
None
See application file for complete search history.

(56) References Cited

U.S. PATENT DOCUMENTS

| 5,280,433 A | 1/1994 | Ettinger et al. |
| 5,645,884 A | 7/1997 | Harlow, Jr. et al. |
| 2004/0247734 A1* | 12/2004 | Unterlander ........ B29C 45/7207 425/528 |
| 2006/0068109 A1 | 3/2006 | Frankenberger et al. |
| 2006/0233945 A1* | 10/2006 | Calvetto ............... B05B 12/122 427/8 |
| 2010/0304009 A1 | 12/2010 | Bausen et al. |

FOREIGN PATENT DOCUMENTS

| EP | 1712294 A1 | 10/2006 |
| NL | 9002167 A | 5/1992 |
| WO | WO2009123624 A1 | 10/2009 |
| WO | 2013119405 A1 | 8/2013 |

OTHER PUBLICATIONS

Mian et al., "Three-Dimensional Model-Based Object Recognition and Segmentation in Cluttered Scenes", Oct. 2006, 1584-1601.*
International Search Report and Written Opinion, dated Nov. 10, 2014, regarding Application No. PCT/US2014/059599, 12 pages.
Mian et al., "Three-Dimensional Model-Based Object Recognition and Segmentation in Cluttered Scenes," IEEE Transactions on Pattern Analysis and Machine Intelligence, vol. 28, No. 10, Aug. 2006, pp. 1584-1601.

* cited by examiner

Primary Examiner — Nathan T Leong
(74) Attorney, Agent, or Firm — Yee & Associates, P.C.

(57) ABSTRACT

A method and apparatus for coating a group of objects may be provided. A three-dimensional model of the group of objects may be generated. Segments that represent each object in the group of objects in the three-dimensional model may be formed. Instructions for coating the group of objects may be generated based on the segments. The instructions may be configured to cause a robotic coating system to coat the group of objects.

21 Claims, 13 Drawing Sheets

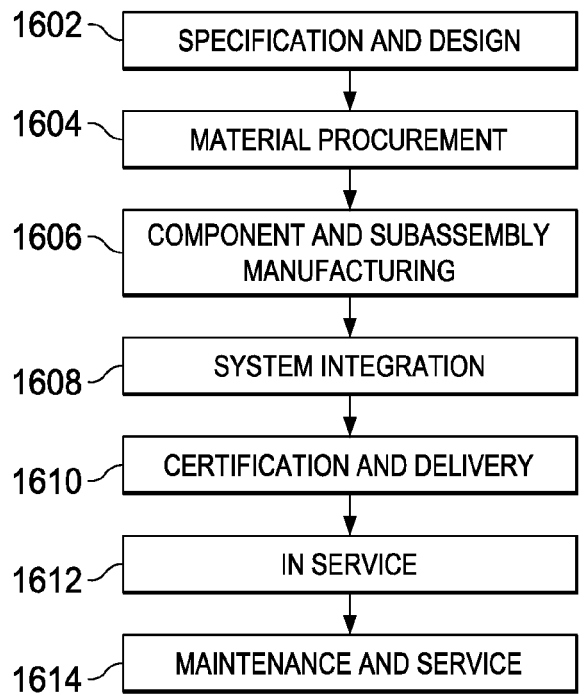
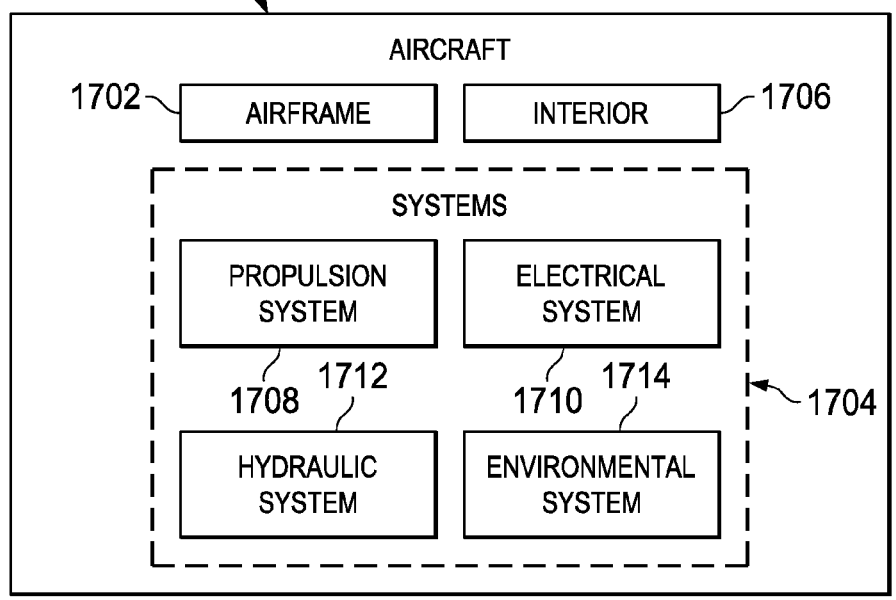

ROBOTIC OBJECT COATING SYSTEM

BACKGROUND INFORMATION

1. Field

The present disclosure relates generally to manufacturing objects, and in particular, to applying a coating to objects. Still more particularly, the present disclosure relates to a method and apparatus for coating objects with a robotic object coating system.

2. Background

The process for manufacturing components for aircraft and other vehicles may be very complex and time-consuming. Components may be manufactured in various stages in which different types of components are fabricated, molded, coated, and tested.

These stages may be performed by robotic systems, human operators, or both robotic systems and human operators. For example, a component for a fuel tank may be fabricated, painted, installed, and/or inspected by a human operator, a robotic system, or some combination thereof.

In some cases, an aircraft may have thousands of components that need to be painted. Consequently, paint may be applied to many different components at one time. For instance, five, ten, fifteen or more objects may be painted during the same interval.

When applying paint or other types of coatings, the components may be arranged on a component carrier, cart, or rack. In some cases, more than one type of component may be present on the component carrier at the same time. Different types of components may have the same or different sizes, shapes, weights, or other characteristics from each other.

Currently, component painting may typically be completed by human painters. However, the painting of aircraft components may be more physically demanding on painters than desired. For example, painters may typically wear head-to-toe protective clothing to limit exposure to toxic chemicals found in the paint. Additionally, painters may carry large reservoirs of paint that may be difficult to maneuver in order to paint the components in a preferred manner. Because these reservoirs may be difficult to maneuver, the painters may become exhausted more quickly than desired.

In some cases, a pre-programmed robotic system may be used to limit exposure by human painters to chemicals in the paint. With robotic painting systems, a controller provides instructions to the robot to paint the objects arranged on the component carrier. However, this type of painting system may not be as accurate as desired. For example, pre-programmed robotic painting systems may have a large margin of error. As a result, a human painter may be needed to inspect and repaint some of the components. This type of process may take more time and effort than desired. Accordingly, there is a need for a method and apparatus which take into account at least some of the issues discussed above, as well as possibly other issues.

SUMMARY

In one illustrative embodiment, a method for coating a group of objects may be presented. A three-dimensional model of the group of objects may be generated. Segments that represent each object in the group of objects in the three-dimensional model may be formed. Instructions for coating the group of objects may be generated based on the segments. The instructions may be configured to cause a robotic coating system to coat the group of objects.

In another illustrative embodiment, a method for painting a group of tubes may be provided. A three-dimensional model of the group of tubes may be generated. Segments for the group of tubes may be formed in the three-dimensional model. Instructions for painting the group of tubes may be generated based on the segments. The instructions may be configured to cause a robotic painting system to paint the group of tubes.

In yet another illustrative embodiment, an apparatus may comprise a coating controller configured to generate a three-dimensional model of a group of objects. The coating controller may be further configured to form segments for the group of objects in the three-dimensional model and generate instructions for coating the group of objects based on the segments. The instructions may be configured to cause a robotic coating system to coat the group of objects.

In still another illustrative embodiment, a method for coating a group of objects may be presented. A three-dimensional model of the group of objects comprising at least one of an aircraft part, a tube, a spar, a reservoir, a stringer, a panel, or a barrel may be generated. The three-dimensional model may be generated in real time and selected from one of a point cloud and a computer-aided design model. Generating the three-dimensional model of the group of objects may comprise generating data about the group of objects using a sensor system associated with a robotic coating system. The sensor system may be selected from one of a camera system or a laser scanner and may comprise a depth sensor. The data may be selected from at least one of images or three-dimensional coordinates for a surface of the group of objects. Generating the three-dimensional model may further comprise generating the three-dimensional model of the group of objects from the data generated by the sensor system. Segments may be formed that represent each object in the group of objects in the three-dimensional model. Forming the segments may comprise identifying clutter in the three-dimensional model and separating objects in the group of objects from the clutter to form a segmented three-dimensional model. Instructions may be generated for coating the group of objects based on the segments. The instructions may be configured to cause a robotic coating system to coat the group of objects. The instructions may comprise at least one of waypoints or trajectories. Generating the instructions may comprise identifying the waypoints along an object in the group of objects and generating a trajectory for movement of the robotic coating system along the object from the waypoints. The robotic coating system may be operated to apply a coating to the group of objects using the instructions. The coating may be selected from one of a paint, an adhesive, a sealant, a lubricant, a wear resistant coating, a corrosion resistant coating, and a scratch resistant coating.

In yet another illustrative embodiment, a method for painting a group of tubes may be provided. A three-dimensional model of the group of tubes may be generated. Segments for the group of tubes may be formed in the three-dimensional model. Instructions may be generated for painting the group of tubes based on the segments. The instructions may be configured to cause a robotic painting system to paint the group of tubes. Generating the instructions may comprise selecting waypoints along a tube in the group of tubes and generating a trajectory for movement of the robotic painting system along the tube from the waypoints. The robotic painting system may then be operated to apply paint to the group of tubes using the instructions.

In still another illustrative embodiment, an apparatus includes a coating controller, a sensor system, and a robotic coating system. The coating controller may be configured to generate a three-dimensional model of a group of objects from data about the group of objects. The coating controller may be further configured to form segments for the group of objects in the three-dimensional model and generate instructions for coating the group of objects based on the segments. The instructions may be configured to cause the robotic coating system to coat the group of objects. The coating may be selected from one of a paint, an adhesive, a sealant, a lubricant, a wear resistant coating, a corrosion resistant coating, and a scratch resistant coating. The group of objects may comprise at least one of an aircraft part, a tube, a spar, a reservoir, a stringer, a panel, or a barrel. The sensor system may be configured to generate the data about the group of objects. The sensor system may comprise a depth sensor and may be selected from one of a camera system and a laser scanner. The robotic coating system may be configured to receive the instructions and use the instructions to apply a coating to the group of objects. The robotic coating system may be configured to be a robotic painting system. The instructions include painting trajectories for the robotic coating system to paint the group of objects.

The features and functions can be achieved independently in various embodiments of the present disclosure or may be combined in yet other embodiments in which further details can be seen with reference to the following description and drawings.

BRIEF DESCRIPTION OF THE DRAWINGS

The novel features believed characteristic of the illustrative embodiments are set forth in the appended claims. The illustrative embodiments, however, as well as a preferred mode of use, further objectives and features thereof, will best be understood by reference to the following detailed description of an illustrative embodiment of the present disclosure when read in conjunction with the accompanying drawings, wherein:

FIG. 16 is an illustration of an aircraft manufacturing and service method in the form of a flowchart in accordance with an illustrative embodiment;

FIG. 17 is an illustration of a block diagram of an aircraft in which an illustrative embodiment may be implemented.

DETAILED DESCRIPTION

The illustrative embodiments recognize and take into account one or more different considerations. For example, the illustrative embodiments recognize and take into account that a system is needed to provide a desired level of accuracy of trajectories for coating objects, while protecting human painters from potential harm from undesired substances in the coating material. Moreover, the illustrative embodiments recognize and take into account that a group of objects to be painted may include components of the same or different types that may have different configurations in space relative to each other. With thousands of different types of components arranged on the component cart in varying combinations, the illustrative embodiments recognize and take into account that an efficient and cost-effective solution is needed to provide a trajectory for a robotic painting arm that reduces the rework for human operators.

Thus, in one illustrative embodiment, a method for coating a group of objects may be provided. A three-dimensional model of the group of objects may be generated. Segments that represent each object in the group of objects in the three-dimensional model may be formed. Instructions for coating the group of objects may be generated based on the segments. These instructions may be configured to cause a robotic coating system to coat the group of objects.

Figure 1:
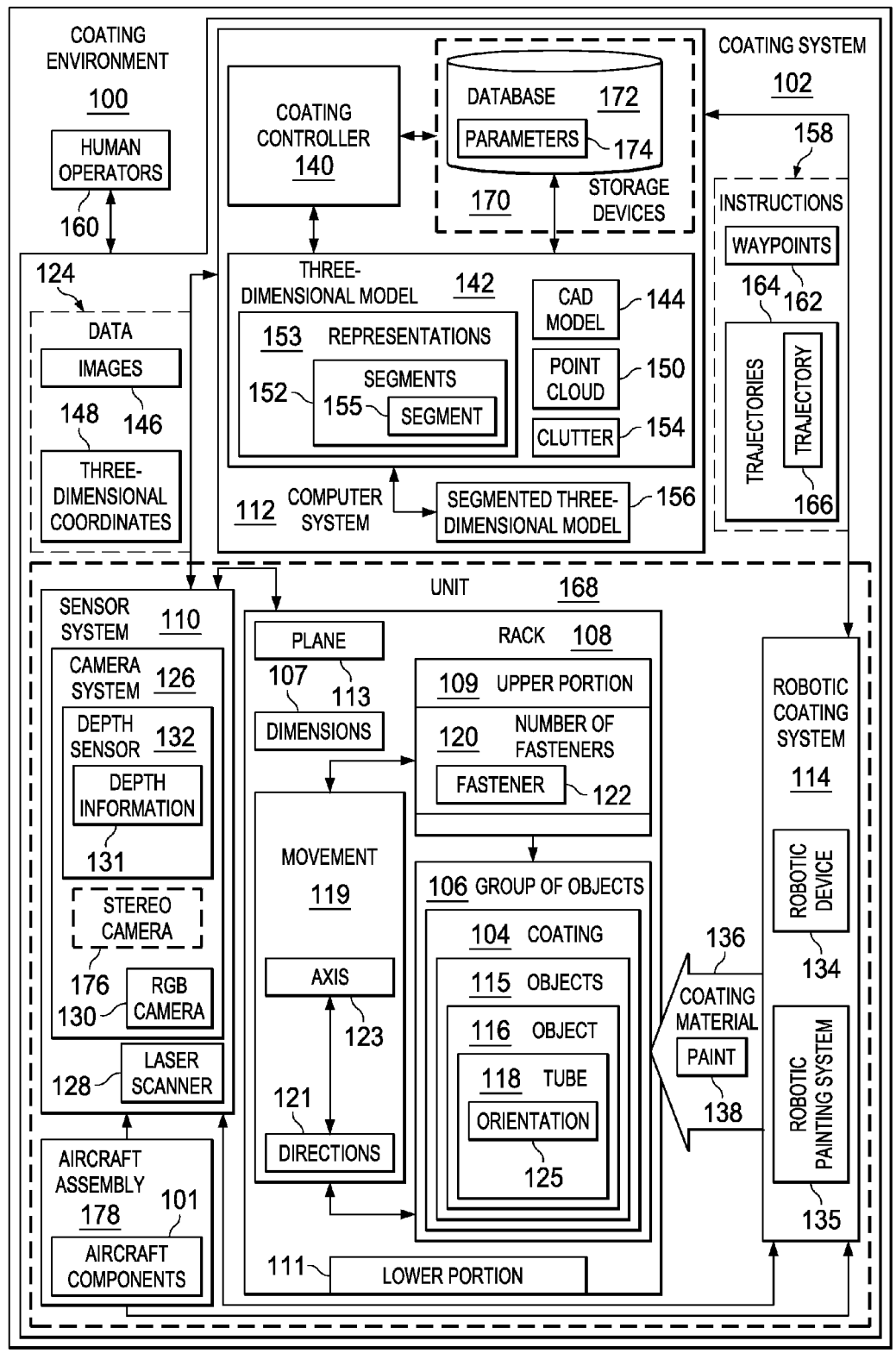
FIG. 1 is an illustration of a block diagram of a coating environment in accordance with an illustrative embodiment.

With reference now to the figures, and in particular, with reference to FIG. 1, an illustration of a block diagram of a coating environment is depicted in accordance with an illustrative embodiment. In this illustrative example, coating environment 100 is an example of an environment in which coating system 102 may be used.

As depicted, coating environment 100 may include coating system 102. Coating system 102 may be configured to apply a coating to one or more aircraft components 101. For example, without limitation, coating system 102 may be used to apply coating 104 to group of objects 106 in this illustrative example.

As used herein, a "group of" items may include one or more items. For example, without limitation, group of objects 106 may be one or more objects 115.

Coating system 102 may be comprised of a number of different components. As depicted, coating system 102 may include rack 108, sensor system 110, computer system 112, and robotic coating system 114.

In this illustrative example, rack 108 may have dimensions 107 and may be a physical device configured to hold group of objects 106 in this example. Rack 108 may be arranged such that it may have plane 113, which may be a y-z plane of rack 108.

As depicted, group of objects 106 may include one or more aircraft components 101 to be coated by robotic coating system 114. Group of objects 106 may include, for example, without limitation, at least one of an aircraft part, a tube, a spar, a reservoir, a stringer, a panel, a barrel, or some other suitable type of object. In some examples, group of objects 106 may include objects 115 of the same or different types.

As used herein, the phrase "at least one of," when used with a list of items, means different combinations of one or more of the listed items may be used and only one of each item in the list may be needed. For example, without limitation, "at least one of item A, item B, or item C" may include, without limitation, item A, item A and item B, or item B. This example also may include item A, item B, and item C or item B and item C. Of course, any combinations of these items may be present. In other examples, "at least one of" may be, for example, without limitation, without limitation, two of item A, one of item B, and ten of item C; four of item B and seven of item C; and other suitable combinations. The item may be a particular object, thing, or a category. In other words, at least one of means any combination of items and number of items may be used from the list but not all of the items in the list may be required.

In this illustrative example, group of objects 106 may include object 116. Object 116 may be tube 118 in this instance. As depicted, tube 118 may be rigid, flexible, or both. Tube 118 may be selected from, for example, without limitation, one of a fuel line, a pipe, a hydraulic hose, an air bleed line, and other suitable types of tubes.

Tube 118 may be positioned on rack 108 such that tube 118 may be suspended from rack 108 by number of fasteners 120. As used herein, "a number of," when used with reference to items, means one or more items. For example, without limitation, number of fasteners 120 may be one or more fasteners.

In this example, tube 118 may be suspended from upper portion 109 of rack 108 by fastener 122. For example, without limitation, fastener 122 may be selected from one of a clip, a chain, a cable, a cord, and other suitable types of fasteners.

In other illustrative examples, tube 118 may be positioned on rack 108 such that fastener 122 may be unnecessary. For example, without limitation, tube 118 may be laid across lower portion 111 of rack 108 and may not be suspended or otherwise attached to rack 108 by fastener 122 in some other manner.

As illustrated, object 116 may be configured such that movement 119 of object 116 occurs. For example, without limitation, tube 118 may move in one or more directions 121 while suspended from rack 108 by fastener 122. For instance, tube 118 may rotate along or about axis 123. Movement 119 of tube 118 may be caused by changes in coating environment 100, movement of rack 108, airflow in coating environment 100, the weight, shape, or size of tube 118, or other factors.

In some examples, movement of rack 108 may shift orientation 125 of tube 118 relative to other objects 115 in group of objects 106. Consequently, objects 115 in group of objects 106 may be suspended from number of fasteners 120 differently relative to one another, even if all of objects 115 in group of objects 106 are the same type of object. For instance, tube 118 may rotate about axis 123 such that it overlaps in space or touches another one of objects 115 in group of objects 106.

As depicted, group of objects 106 may have a variety of shapes, sizes, weights, and configurations. For example, without limitation, group of objects 106 may be one object, five objects, ten objects, twenty objects, or some other suitable number of objects. Group of objects 106 may be of the same type or a different type. As an example, if group of objects 106 includes five objects, then group of objects 106 may include two tubes, two reservoirs, and a spar.

Of course, this example is just one example of group of objects 106 and thousands of other combinations may be possible. As each of the different objects 115 may be suspended from rack 108 by number of fasteners 120, each of objects 115 may move relative to one another.

In some examples, object 116 in group of objects 106 may be secured by more than one of number of fasteners 120. As an example, object 116 may be arranged on rack 108 such that one end of object 116 may be fastened to upper portion 109 of rack 108, while another end of object 116 may be fastened to lower portion 111 of rack 108. In this case, object 116 may be more stable such that object 116 does not rotate about axis 123.

In other examples, however, using multiple fasteners in number of fasteners 120 for each of objects 115 in group of objects 106 may not be feasible. For instance, object 116 may have an asymmetrical shape such that only one end of object 116 may be fastened to rack 108. In other examples, different lengths of objects 115 in group of objects 106 may result in some objects being fastened to rack 108 using only one fastener 122, while other objects may be fastened to rack 108 using more than one of number of fasteners 120.

As depicted, sensor system 110 may be configured to generate data 124 about group of objects 106. In this illustrative example, sensor system 110 may be a motion sensing input device selected from at least one of camera system 126, laser scanner 128, or other suitable types of sensor systems. Sensor system 110 may be configured to be lightweight, low cost, and portable compared to some currently used sensor systems.

Camera system 126 may include various types of components in these illustrative examples. For example, without limitation, camera system 126 may include red-green-blue (RGB) camera 130, depth sensor 132, and other components.

Depth sensor 132 may be configured to generate depth information 131 about each object in group of objects 106. In this manner, depth sensor 132 may generate data 124 about orientation 125 of each of group of objects 106 in a space.

In some illustrative examples, depth sensor 132 may include an infrared laser projector and a monochrome complementary metal-oxide-semiconductor (CMOS) sensor (not shown). In other examples, depth sensor 132 may include various other components or configurations of components.

In this illustrative example, sensor system 110 may be configured to capture data 124 about group of objects 106 in various light conditions. As an example, sensor system 110 may be configured to generate data 124 about group of objects 106 under ambient light conditions.

In various illustrative examples, the sensing range of sensor system 110 may be adjustable. For example, without limitation, the sensing range of depth sensor 132 may be about three to about ten meters in some examples. In other examples, the sensing range of depth sensor 132 may be more or less, depending on the particular implementation.

In one illustrative example, sensor system 110 may be configured to operate, for example, without limitation, at a speed of about 60 frames per second. In other examples, sensor system 110 may be configured to operate at higher or lower speeds as well.

When sensor system 110 is laser scanner 128, various techniques may be employed to generate depth information 131 about group of objects 106. For example, without limitation, time of flight, triangulation, or other suitable techniques may be used.

As illustrated, robotic coating system 114 may include robotic device 134 and may be configured to move around group of objects 106 to coat group of objects 106 with one or more types of coating material 136. In some examples, robotic coating system 114 may be robotic painting system 135.

Coating material 136 may take a number of different forms in this illustrative example. For example, without limitation, coating material 136 may be paint 138. In other examples, coating material 136 may be selected from at least one of an adhesive, a sealant, a lubricant, a wear resistant coating, a corrosion resistant coating, a scratch resistant coating, or other suitable type of coating. Coating material 136 may be applied to one or more of objects 115 in group of objects 106 to form coating 104 in this illustrative example.

Coating material 136 may be applied to objects 115 in a number of different ways. For example, without limitation, coating material 136 may be applied using airspray, airless spray, electrostatic spraying, powder coating, rotary atomizing, drip coating, flow coating, curtain coating, roll coating, electro-coating, autodeposition, or applied in another suitable manner using robotic device 134.

With some illustrative examples, robotic device 134 may be configured to apply coating material 136 at a speed of, for example, without limitation, five meters per second. Of course, robotic device 134 may apply coating material 136 faster or slower, depending on the particular implementation.

In this illustrative example, coating controller 140 may be located in computer system 112. Computer system 112 may be comprised of a number of computers. When more than one computer is present in computer system 112, those computers may communicate with each other through a communications medium such as a network.

In some examples, coating controller 140 in computer system 112 may be associated with or remote to one of sensor system 110 and robotic coating system 114. As used herein, when one component is "associated" with another component, the association may be a physical association in the depicted examples.

For example, without limitation, a first component, such as computer system 112 may be considered to be associated with a second component, such as robotic coating system 114, by being secured to the second component, bonded to the second component, mounted to the second component, welded to the second component, fastened to the second component, and/or connected or attached to the second component in some other suitable manner. The first component also may be connected to the second component using a third component. Further, the first component may be considered to be associated with the second component by being formed as part of and/or as an extension of the second component.

In other examples, computer system 112 with coating controller 140 may be a remote unit. In this case, coating controller 140 may communicate with sensor system 110 and robotic coating system 114 through a wired or wireless communications medium.

In this depicted example, coating controller 140 may be configured to generate three-dimensional model 142. As depicted, coating controller 140 may receive input from sensor system 110 for use in generating three-dimensional model 142 of group of objects 106. In particular, coating controller 140 may receive data 124 from sensor system 110.

In this example, sensor system 110 may be configured to stream data 124 for use by coating controller 140 in real time. Data 124 may include, for example, without limitation, images 146, three-dimensional coordinates 148, or other suitable types of information.

In these illustrative examples, three-dimensional coordinates 148 in data 124 from sensor system 110 may form point cloud 150. Three-dimensional model 142 may be constructed from point cloud 150 in some of these examples.

In some illustrative examples, point cloud 150 may be used to create computer-aided design (CAD) model 144 through a surface restructuring process. In other embodiments, point cloud 150 may be used to create other types of three-dimensional models, depending on the particular implementation. In still other illustrative examples, point cloud 150 may be directly rendered and inspected.

As depicted, coating controller 140 may perform image segmentation on three-dimensional model 142. In other words, coating controller 140 uses image segmentation to form segments 152 that represent objects 115 in group of objects 106.

As depicted, coating controller 140 may identify segments 152 and clutter 154 in data 124. Segments 152 may be representations 153 of objects 115 in group of objects 106. For example, without limitation, data 124 may be segmented to identify segment 155 in segments 152 corresponding to tube 118.

Coating controller 140 may be further configured to remove clutter 154 from three-dimensional model 142 to form segmented three-dimensional model 156. In this illustrative example, clutter 154 may be data 124 that may not be needed for representations 153 of group of objects 106. For example, without limitation, clutter 154 may include data points from rack 108, a wall behind rack 108, or other data points that may not be needed for three-dimensional model 142.

In this depicted example, after separating segments 152 from clutter 154 to form segmented three-dimensional model 156, coating controller 140 also may identify waypoints 162 along each of segments 152. For example, without limitation, coating controller 140 may identify waypoints 162 along segments 152 of tube 118.

A number of trajectories 164 for robotic device 134 may be generated between waypoints 162 in this illustrative example. For instance, trajectory 166 may be generated between two or more of waypoints 162. Additional trajectories 164 may be generated between waypoints 162 until all of segments 152 have trajectories 164.

In this example, at least one of waypoints 162 or trajectories 164 may be communicated to robotic coating system 114 by coating controller 140. This communication may be wired or wireless, depending on the particular implementation.

In various embodiments, instructions 158 may be configured to cause robotic coating system 114 to coat group of objects 106. For example, without limitation, instructions 158 may be generated by coating controller 140 such that robotic device 134 uses paint 138 to paint each of objects 115 in group of objects 106 according to desired parameters.

In some examples, sensor system 110 may be associated with robotic coating system 114 such that the two components may both be housed in unit 168. In other embodiments, sensor system 110 may be a separate component from robotic coating system 114 and communicate through a wired or wireless communications medium.

When sensor system 110 and robotic coating system 114 are housed in unit 168, robotic device 134 may scan group of objects 106 to form three-dimensional model 142. Robotic device 134 may then follow the same trajectory 166 to coat group of objects 106.

When sensor system 110 and robotic coating system 114 are not housed together in unit 168, one of human operators 160 may operate sensor system 110 to generate data 124. In other examples, sensor system 110 may be operated automatically.

Figure 2:
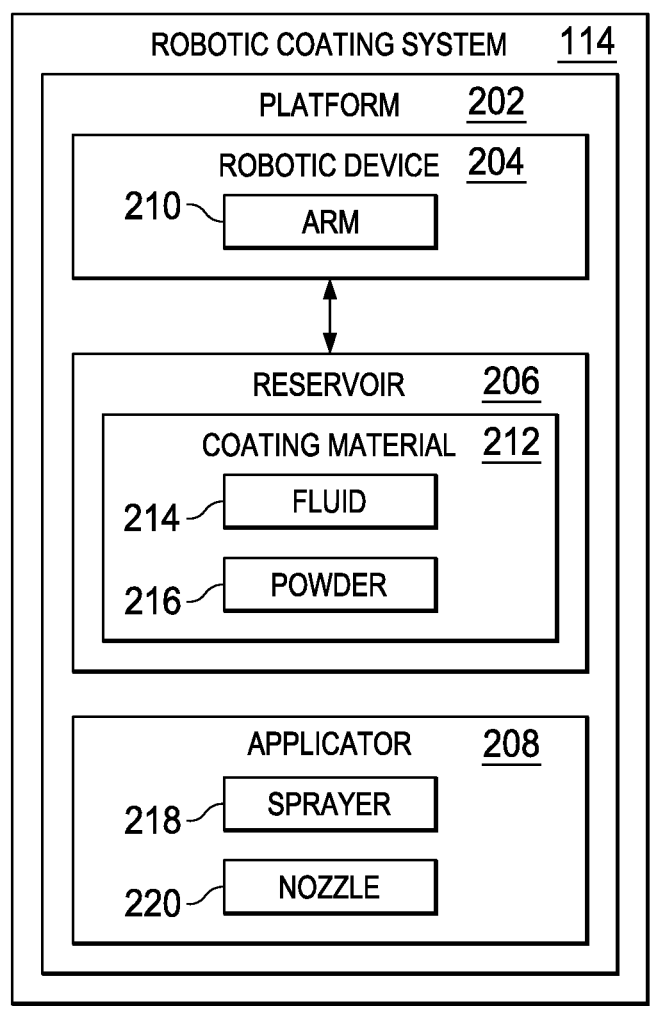
FIG. 2 is an illustration of a block diagram of a robotic coating system in accordance with an illustrative embodiment.

Turning now to FIG. 2, an illustration of a block diagram of robotic coating system 114 from FIG. 1 is depicted in accordance with an illustrative embodiment. In this illustrative example, robotic coating system 114 may include a number of different components. For example, without limitation, robotic coating system 114 may include platform 202, robotic device 204, reservoir 206, and applicator 208.

In this illustrative example, platform 202 may be a structure with which robotic device 204, reservoir 206, and applicator 208 may be physically associated. For example, without limitation, robotic device 204 may be secured, bonded, mounted, welded, fastened, and/or connected to platform 202 in some other suitable manner.

In some examples, platform 202 may move or slide along rails, tracks, or other types of movement systems. Of course, in other examples, more than one robotic coating system 114 may be present with multiple other components.

As depicted, robotic device 204 may be arm 210. Both robotic device 204 and reservoir 206 may be physically associated with platform 202. In these illustrative examples, robotic device 204 may be configured to move applicator 208 to coat group of objects 106 in FIG. 1.

Reservoir 206 may store coating material 212 for arm 210 to apply coating material 212 to group of objects 106. For example, without limitation, reservoir 206 may store fluid 214 or powder 216 for robotic coating system 114 to apply to group of objects 106. Of course, in other illustrative examples, coating material 212 may be other types of coating materials other than fluid 214 and powder 216, depending on the particular implementation.

In these illustrative examples, applicator 208 may be associated with robotic device 204. Applicator 208 may be, for example, without limitation, sprayer 218, nozzle 220, or some other suitable type of applicator. One or both of sprayer 218 and nozzle 220 may be used to apply coating material 212 to group of objects 106 in these illustrative examples.

In other examples, more than one applicator 208 may be present in robotic coating system 114. In still other examples, arm 210 may apply coating material 212 to group of objects 106 using a different type of applicator 208 other than sprayer 218 and nozzle 220.

In operation, robotic coating system 114 may receive instructions 158 from coating controller 140 in FIG. 1. In particular, robotic coating system 114 may receive trajectories 164 from FIG. 1 and follow trajectories 164 when coating group of objects 106.

Robotic coating system 114 may then use robotic device 204 with applicator 208 to coat group of objects 106 using coating material 212 stored in reservoir 206. For instance, robotic coating system 114 may use sprayer 218 to paint tube 118 from FIG. 1 with fluid 214. In another example, robotic coating system 114 may use nozzle 220 to dispense powder 216 onto tube 118.

In these illustrative examples, robotic coating system 114 follows trajectories 164 based on segmented three-dimensional model 156 in FIG. 1. In some illustrative examples, as sensor system 110 may acquire new data 124, robotic coating system 114 may receive additional or updated instructions 158 in real time. These updated instructions 158 may include trajectories 164 that have been adjusted for spatial changes in group of objects 106. For instance, if movement 119 causes tube 118 to rotate about axis 123 in FIG. 1, instructions 158 may be altered to provide more accurate trajectories 164 for painting tube 118.

In alternative examples, instructions 158 may be received by robotic coating system 114 at one time and may not be updated based on additional data 124 from sensor system 110. In this instance, for example, without limitation, tube 118 may be painted with fluid 214 and then inspected by sensor system 110 to determine whether tube 118 is painted as desired. Accordingly, data 124 may form three-dimensional model 142 in FIG. 1 that may be used to touch up tube 118 with fluid 214 when needed. In this manner, sensor system 110 may provide both data collection and inspection functions.

Figure 3:
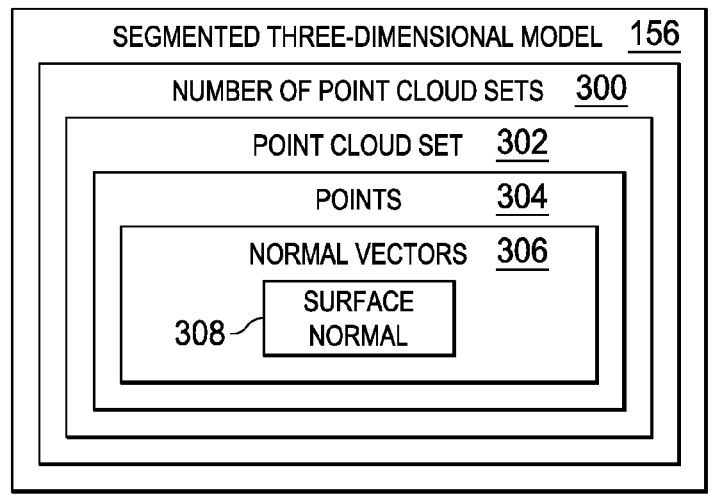
FIG. 3 is an illustration of a block diagram of a segmented three-dimensional model in accordance with an illustrative embodiment.

With reference now to FIG. 3, an illustration of a block diagram of segmented three-dimensional model 156 from FIG. 1 is depicted in accordance with an illustrative embodiment. In this illustrative example, segmented three-dimensional model 156 includes number of point cloud sets 300.

A "set," as used herein with reference to items, means zero or more items. For example, without limitation, point cloud set 302 in number of point cloud sets 300 includes zero or more points 304. In other words, point cloud set 302 in number of point cloud sets 300 may be a null set.

As depicted, each of number of point cloud sets 300 corresponds to one of group of objects 106 in FIG. 1. For example, without limitation, point cloud set 302 may include points 304 for tube 118 in FIG. 1.

As illustrated, each of number of point cloud sets 300 has a number of points 304. Normal vectors 306 correspond to each one of a number of points 304.

In this example, one of normal vectors 306 may be a vector that is perpendicular to the tangent plane of one of points 304. In other words, each of normal vectors 306 may be normal to surface normal 308 of each of points 304.

In this illustrative example, number of point cloud sets 300 may be used to generate trajectories 164 for robotic coating system 114 in FIG. 1. For example, without limitation, point cloud set 302 may be used to generate trajectory 166 for robotic coating system 114 to apply coating material 136 to tube 118 in FIG. 1.

Figure 4:
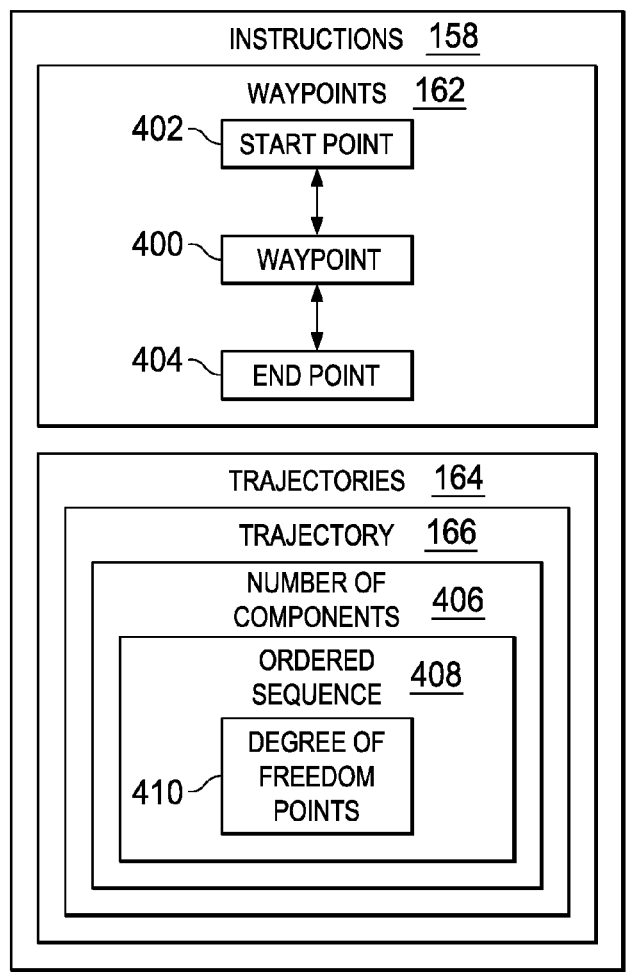
FIG. 4 is an illustration of a block diagram of instructions for a robotic coating system in accordance with an illustrative embodiment.

With reference now to FIG. 4, an illustration of a block diagram of instructions 158 for robotic coating system 114 from FIG. 1 is depicted in accordance with an illustrative embodiment. As depicted, waypoints 162 may include waypoint 400. Waypoint 400 may be start point 402 or end point 404 in some examples. In other examples, waypoint 400 may be one of waypoints 162 other than start point 402 and end point 404.

In this illustrative example, start point 402 may be one of waypoints 162 identified for robotic coating system 114 to begin coating tube 118 in FIG. 1. End point 404 may be one of waypoints 162 identified for robotic coating system 114 to stop coating tube 118. In some illustrative examples, end point 404 may signify the end of a particular portion of painting tube 118. For example, without limitation, robotic coating system 114 may switch the type of coating material 136 used on tube 118 in some examples.

As depicted, trajectory 166 in trajectories 164 may include number of components 406. Each of number of components 406 corresponds to a portion of trajectory 166 between two of waypoints 162. In other words, number of components 406 may be put together to form a complete trajectory 166 in these examples.

In this illustrative example, each of components 406 may include ordered sequence 408 of degree of freedom points 410 for robotic coating system 114. Degree of freedom points 410 may be points with six degrees of freedom in these examples. Ordered sequence 408 of degree of freedom points 410 may be executed by arm 210 to apply fluid 214 in FIG. 2 to tube 118.

The illustration of coating environment 100 in FIG. 1 and the different components of coating environment 100 shown in FIGS. 2-4 are not meant to imply physical or architectural limitations to the manner in which an illustrative embodiment may be implemented. Other components in addition to, or in place of, the ones illustrated may be used. Some components may be optional. Also, the blocks are presented to illustrate some functional components. One or more of these blocks may be combined, divided, or combined and divided into different blocks when implemented in an illustrative embodiment.

For example, without limitation, a number of storage devices 170 may be included in coating controller 140. Storage devices 170 may be, for example, without limitation, a random access memory, a read only memory, a hard disk drive, a solid state disk drive, and/or any other suitable storage device capable of storing program code in a functional form.

In this case, storage devices 170 may include database 172 that may store parameters 174 for different types of objects 115 in group of objects 106. Parameters 174 may include computer-aided design model 144 for previously painted objects 115, colors of paint 138 for each of objects 115, desired cycle time, painting method, or other information to add to instructions 158 sent to robotic coating system 114.

For example, without limitation, different types of coating material 136 may be applied to tube 118 than may be applied to another of objects 115. With the use of database 172, coating controller 140 may use parameters 174 to apply the desired type of coating material 136 more accurately to each of objects 115 in group of objects 106.

In other illustrative examples, camera system 126 may be stereo camera 176. In this example, stereo camera 176 may have two or more lenses with a separate image sensor for each lens. This configuration allows stereo camera 176 to capture data 124 for three-dimensional rendering.

In still other examples, aircraft assembly 178 may be present in coating environment 100 in addition to or in place of rack 108. In other words, aircraft components 101 may already be installed in aircraft assembly 178 before painting. With the use of an illustrative embodiment, whole assemblies or combinations of components may be coated by robotic coating system 114 quickly and easily, without risk of undesired effects for human operators 160.

Although the illustrative examples are shown with one sensor system 110, robotic coating system 114, and coating controller 140, various examples may include more than one sensor system 110, robotic coating system 114, and coating controller 140. In this instance, the components in coating environment 100 may be arranged to provide the desired level of accuracy for data 124 and instructions 158.

One or more of the components in coating system 102 may also be implemented in different stages of manufacturing using a conveyer belt. For example, without limitation, sensor system 110 may continuously scan a number of group of objects 106 on more than one rack 108 that move along a conveyor belt. In this example, coating controller 140 continuously streams data 124 and converts point cloud 150 into instructions 158 with usable trajectories 164 for each group of objects 106 on each rack 108. Each rack 108 may then enter coating environment 100 where robotic coating system 114 coats group of objects 106 according to instructions 158 for that group of objects 106. As yet another illustrative example, robotic coating system 114 may include one or more additional robotic devices in addition to or in place of robotic device 204.

Although coating controller 140 is described as being located in computer system 112, coating controller 140 may be implemented in some other manner. Coating controller 140 may be implemented in software, hardware, firmware or a combination thereof. When software is used, the operations performed by coating controller 140 may be implemented in program code configured to run on a processor unit.

When firmware is used, the operations performed by coating controller 140 may be implemented in program code and data and stored in persistent memory to run on a processor unit. When hardware is employed, the hardware may include circuits that operate to perform the operations in coating controller 140.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations.

Examples of programmable logic devices may include, for example, without limitation, a programmable logic array, a programmable array logic, a field programmable logic array, a field programmable gate array, and other suitable hardware devices. Additionally, the processes may be implemented in organic components integrated with inorganic components and/or may be comprised entirely of organic components excluding a human being. For example, without limitation, the processes may be implemented as circuits in organic semiconductors.

Figure 5:
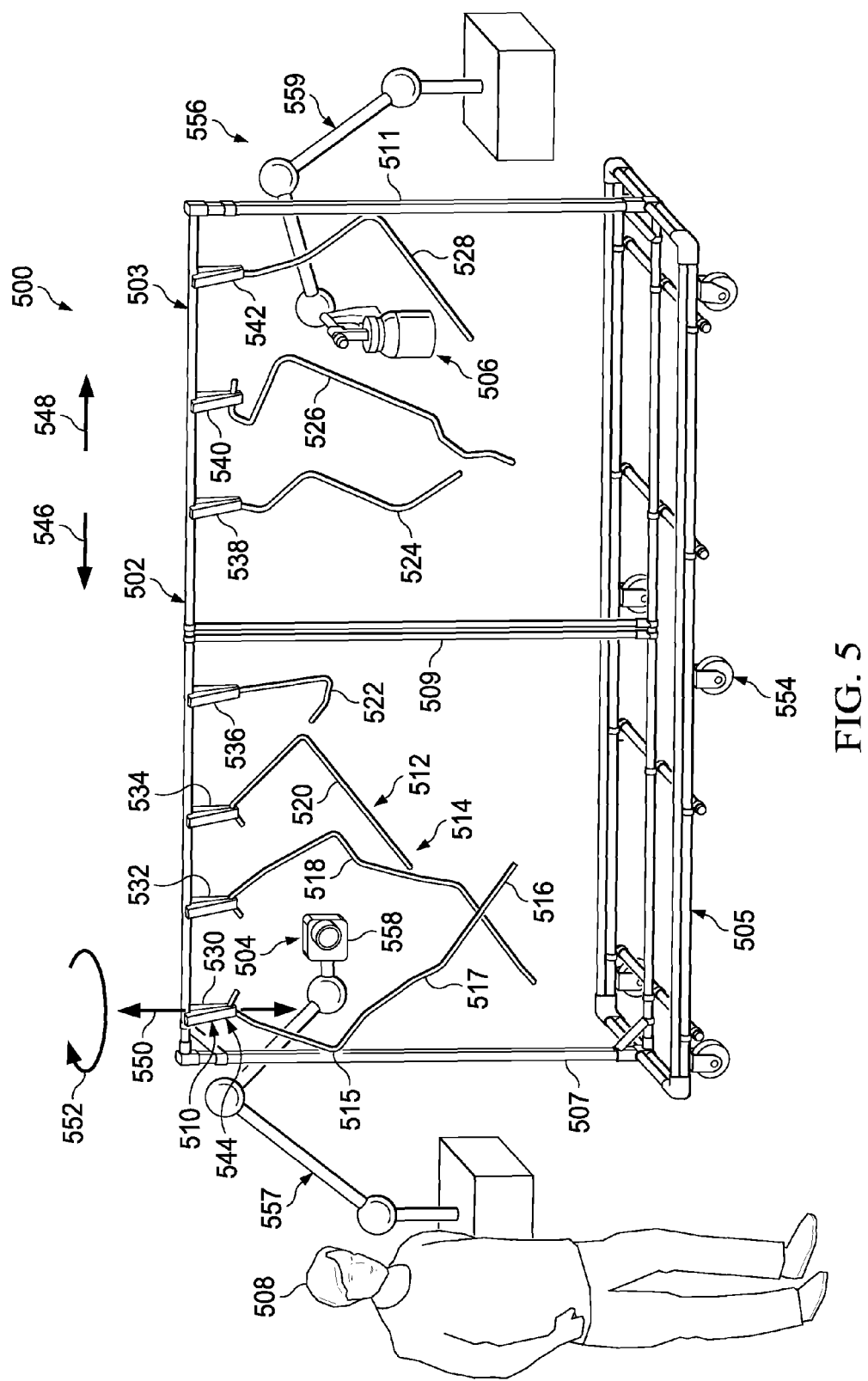
FIG. 5 is an illustration of a coating environment in accordance with an illustrative embodiment.

In FIG. 5, an illustration of a coating environment is depicted in accordance with an illustrative embodiment. Coating environment 500 may be an example of coating environment 100 shown in block form in FIG. 1.

As depicted, coating environment 500 includes rack 502, sensor system 504, robotic coating system 506, and human operator 508. Rack 502 may be one implementation for rack 108, while sensor system 504 and robotic coating system 506 may be implementations for sensor system 110 and robotic coating system 114 in FIG. 1, respectively.

In this illustrative example, rack 502 may have upper portion 503 and lower portion 505 and supports 507, 509, and 511. A number of fasteners 510 may be arranged along upper portion 503 of rack 502.

In this illustrative example, group of objects 512 may be associated with rack 502 and may include group of tubes 514. In other illustrative examples, group of objects 512 may include at least one of tubes, spars, stringers, reservoirs, barrels, or other aircraft components 101.

In this illustrative example, group of tubes 514 may be fastened to rack 502 using number of fasteners 510. In some illustrative examples, fasteners 510 may be part of rack 502.

As illustrated, each of group of tubes 514 may hang from rack 502 by one end of each tube. In other illustrative examples, group of tubes 514 may be held in place by two or more of fasteners 510 arranged along group of tubes 514.

As illustrated, group of tubes 514 hang from fasteners 510. In particular, group of tubes 514 includes tube 516, 518, 520, 522, 524, 526, and 528 hanging from fastener 530, 532, 534, 536, 538, 540, and 542, respectively.

In this example, tube 516 may have bend 515 and straight portion 517. In other examples, each of group of tubes 514 may have one or more of bend 515, depending on the implementation.

In this depicted example, fasteners 510 may be clips 544. In other illustrative examples, fasteners 510 may be chains, cables, cords, or other suitable types of fasteners. Clips 544 may be arranged along upper portion 503 of rack 502 such that clips 544 and group of tubes 514 may move. For example, without limitation, clips 544 may be configured such that group of tubes 514 may move along upper portion 503 of rack 502 in the direction of arrow 546 or arrow 548. Clips 544 also may lock in place as desired.

In this example, tube 516 may rotate relative to tube 518. For example, without limitation, tube 516 may rotate about axis 550 in the direction of arrow 552. Each of tube 518, 520, 522, 524, 526, and 528 may also rotate relative to one another in these illustrative examples. In other illustrative examples, a number of additional fasteners may be provided on lower portion 505 of rack 502. When group of tubes 514 are straight, tubes 516, 518, 520, 522, 524, 526, and 528 may be attached to fasteners on lower portion 505 as well as fasteners 510 on upper portion 503 of rack 502.

As depicted, rack 502 may include wheels 554 extending from lower portion 505. Wheels 554 may be configured to move rack 502 into painting booth 556. In other examples, rack 502 may be positioned on a conveyor belt or other automatic device such that wheels 554 may not be present to move rack 502 from one stage in the manufacturing process to another stage in the manufacturing process.

As illustrated, sensor system 504 may include camera system 558. Camera system 558 may include various components such as, for example, without limitation, one or more sensors, a camera, processing components, or other suitable components.

In some illustrative examples, camera system 558 may be operated by human operator 508. In other examples, camera system 558 may be operated automatically to perform a scan of group of tubes 514 hanging from rack 502. In this example, camera system 558 is associated with robotic device 557 which may be configured to automatically scan group of tubes 514 hanging from rack 502. As camera system 558 automatically scans group of objects 512, human operator 508 may oversee the scan and modify camera system 558 as needed.

In some examples, rack 502, sensor system 504, and robotic coating system 506 may be associated with painting booth 556. Human operator 508 may or may not be present in painting booth 556.

In other examples, human operator 508 may scan group of objects 512 outside painting booth 556 and move rack 502 into painting booth 556 for coating by robotic coating system 506. In some examples, the movement of rack 502 with group of objects 512 may be done by an automated system. In this example, coating system 506 may include robotic device 559. Robotic device 559 may be an example for one implementation for robotic device 134 shown in block form in FIG. 1.

The illustration of coating environment 500 is not meant to limit the manner in which different illustrative embodiments may be implemented. For example, without limitation, sensor system 504 may be implemented within robotic coating system 506 such that human operator 508 may not be needed in coating environment 500.

In other examples, sensor system 504 may include more than one camera system 558. In still other illustrative examples, group of objects 512 may include objects other than group of tubes 514 or may include more or fewer group of tubes 514 than shown in rack 502.

Figure 6:
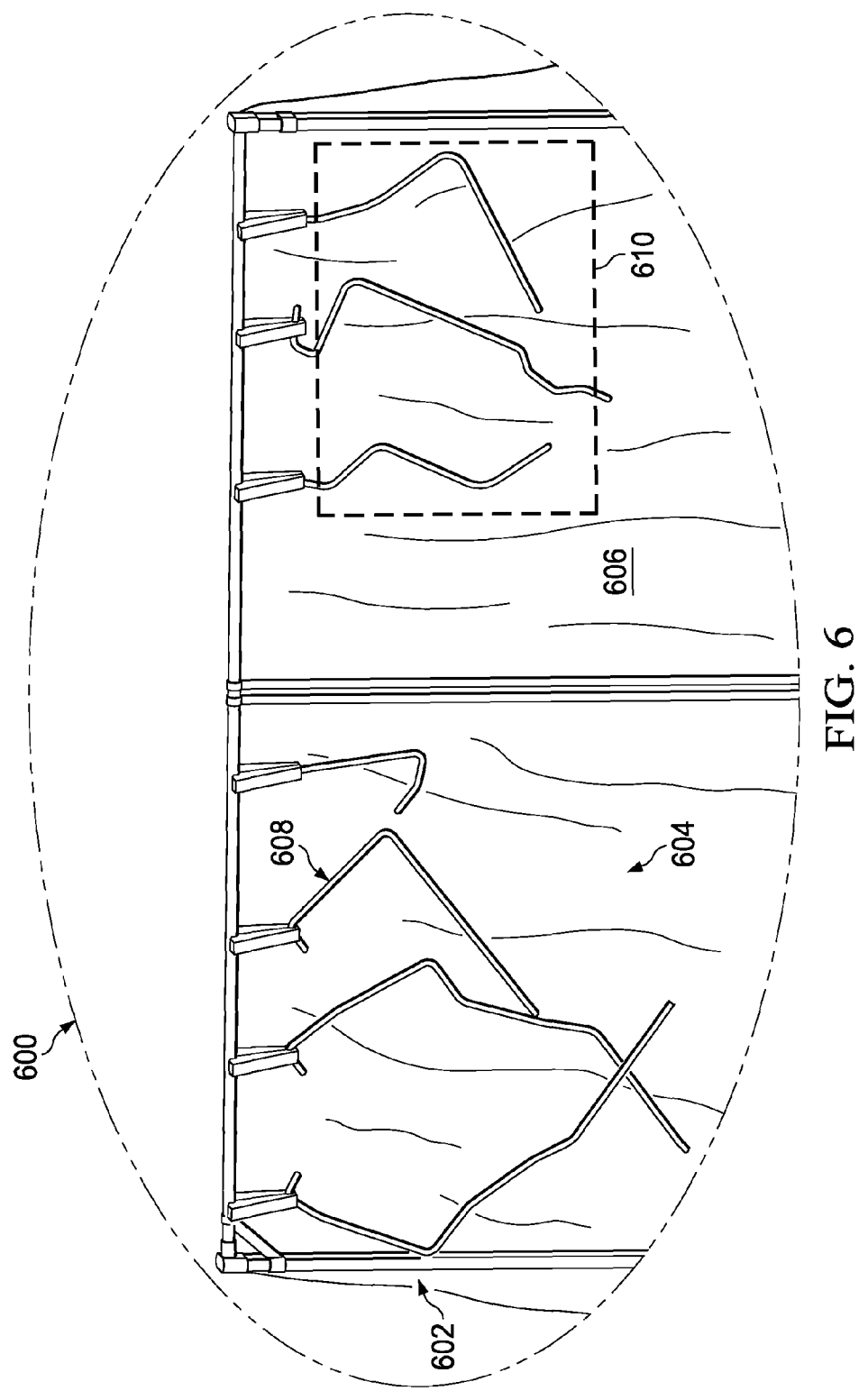
FIG. 6 is an illustration of a surface reconstruction of a group of objects in accordance with an illustrative embodiment.

In FIG. 6, an illustration of a surface reconstruction of group of objects 512 in FIG. 5 is depicted in accordance with an illustrative embodiment. Surface reconstruction 600 may be one example of an implementation of three-dimensional model 142 of segments 152 from point cloud 150 for segmented three-dimensional model 156 shown in block form in FIG. 1. In this illustrative example, surface reconstruction 600 may be a linear approximation of the surface of group of objects 512 in FIG. 5.

In this depicted example, reconstruction algorithms may be used to generate surface reconstruction 600 from a point cloud (not shown) of group of objects 512 generated by coating controller 140 in FIG. 1. These reconstruction algorithms may be any suitable reconstruction algorithms available to generate surface reconstruction 600 from a point cloud of group of objects 512. In one example, a Delaunay tetrahedralization of the points may be computed and labeled. In other examples, other suitable reconstruction algorithms known in the art may be used.

Surface reconstruction 600 may include data points 602. Data points 602 may be an example of surface normals for three-dimensional coordinates 148 of rack 502 and group of tubes 514 shown in FIG. 5 after surface reconstruction has taken place.

As depicted, surface reconstruction 600 may include representations 604 of group of tubes 514 and clutter 606. Representations 604 may be data 124 from FIG. 1 about tubes 608. In this illustrative example, tubes 608 may be part of group of tubes 514. Clutter 606 may be data 124 about other portions of coating environment 500 such as a background, upper portion 503 and supports 507, 509, and 511 of rack 502, among others.

In this depicted example, portion 610 of surface reconstruction 600 may include representations 604 of tubes 608 that may be processed. In particular, portion 610 may include three-dimensional coordinates 148 for surface reconstruction 600 that may be sent to coating controller 140 in FIG. 1. Coating controller 140 may then process surface reconstruction 600 and subsequently generate instructions 158 for robotic coating system 114.

Figure 7:
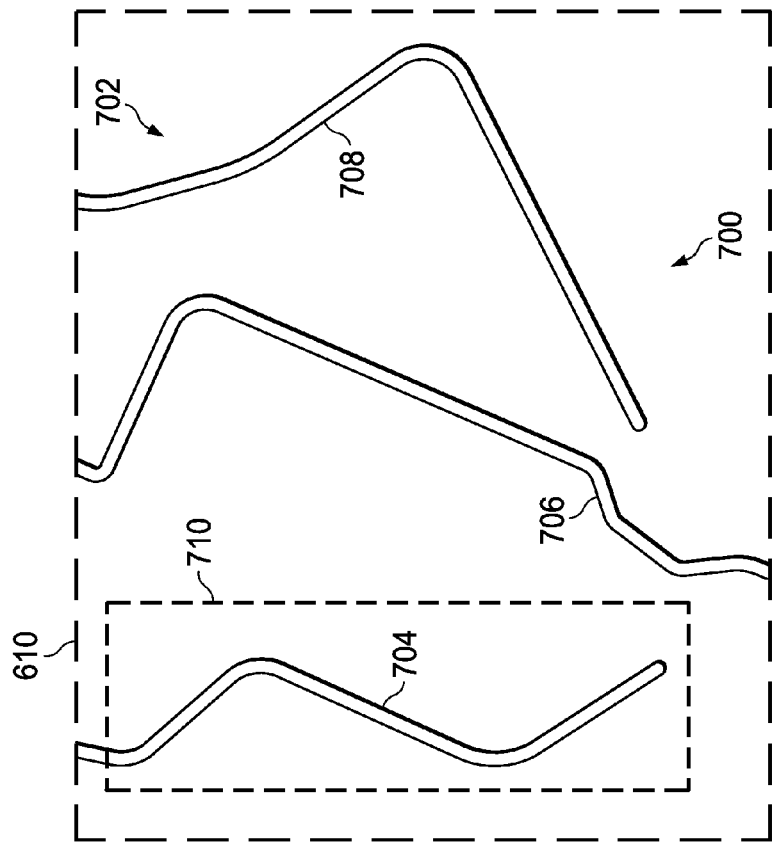
FIG. 7 is an illustration of segments of a group of tubes in accordance with an illustrative embodiment.

Turning to FIG. 7, an illustration of segments of group of tubes 514 from FIG. 5 using surface reconstruction 600 from FIG. 6 is depicted in accordance with an illustrative embodiment. In FIG. 7, segments 700 formed from portion 610 of surface reconstruction 600 in FIG. 6 are shown in FIG. 7. Segments 700 may be one example of an implementation for segments 152 in FIG. 1. In this example, segments 152 may be formed by coating controller 140 in FIG. 1.

In this illustrative example, coating controller 140 may have formed segments 700 of surface reconstruction 600 in FIG. 6. In particular, segment 704, segment 706, and segment 708 may be shown.

As depicted, segments 700 may be formed and clutter 606 may be removed from surface reconstruction 600 in FIG. 6. In this illustrative example, segments 700 may form segmented three-dimensional model 702. Segmented three-dimensional model 702 may be an example of segmented three-dimensional model 156 shown in block form in FIG. 1. Segmented three-dimensional model 702 may then be analyzed and may be used by coating controller 140 to generate instructions 158 for robotic coating system 114. Section 710 with segment 704 may also be shown in this illustrative example.

Figure 8:
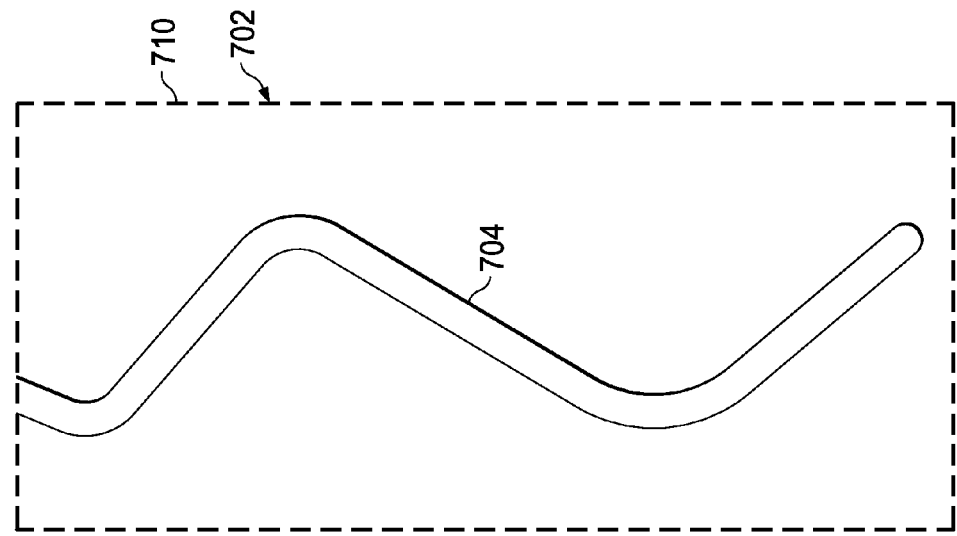
FIG. 8 is an illustration of a section of a segmented three-dimensional model in accordance with an illustrative embodiment.

Turning next to FIG. 8, an illustration of section 710 of segmented three-dimensional model 702 from FIG. 7 is depicted in accordance with an illustrative embodiment. In this example, segment 704 in section 710 of segmented three-dimensional model 702 is shown. Segment 704 may correspond to a three-dimensional rendering of tube 118 in group of objects 106 in FIG. 1.

Figure 9:
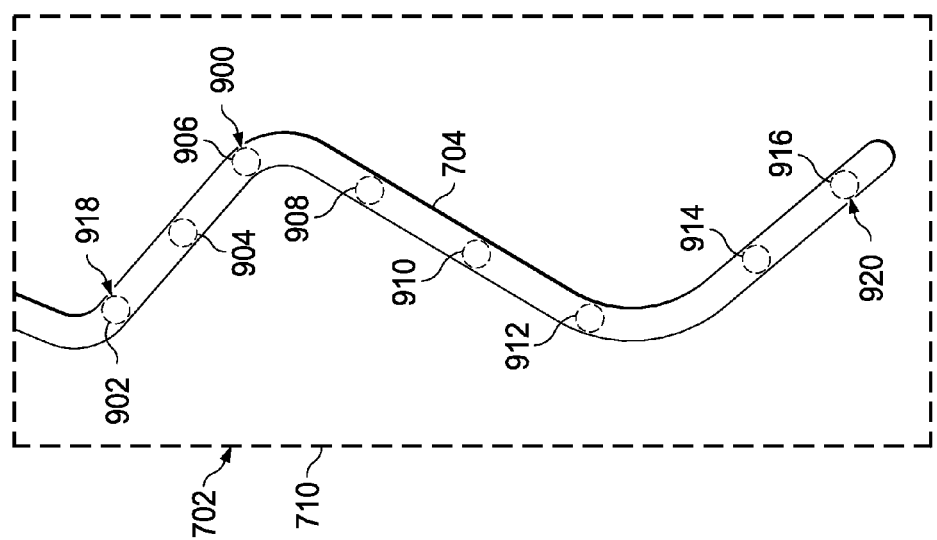
FIG. 9 is an illustration of a segment with waypoints in accordance with an illustrative embodiment.

In FIG. 9, an illustration of segment 704 from FIG. 8 with waypoints is depicted in accordance with an illustrative embodiment. In this example, waypoints 900 may be an example of waypoints 162 generated by coating controller 140 in FIG. 1.

In this illustrative example, eight waypoints 900 are shown. In other examples, more or fewer waypoints 900 may be generated by coating controller 140, depending on the particular implementation.

As illustrated, waypoints 900 may include waypoint 902, 904, 906, 908, 910, 912, 914, and 916. In this example, waypoint 902 may be start point 918, which may indicate where robotic coating system 114 in FIG. 1 may begin painting segment 704.

Waypoint 916 may be end point 920, which may indicate where robotic coating system 114 may end painting segment 704. After identifying waypoints 900 along segment 704 of segmented three-dimensional model 702, coating controller 140 may generate trajectory 166 from FIG. 1 between one or more of waypoints 900.

Figure 10:
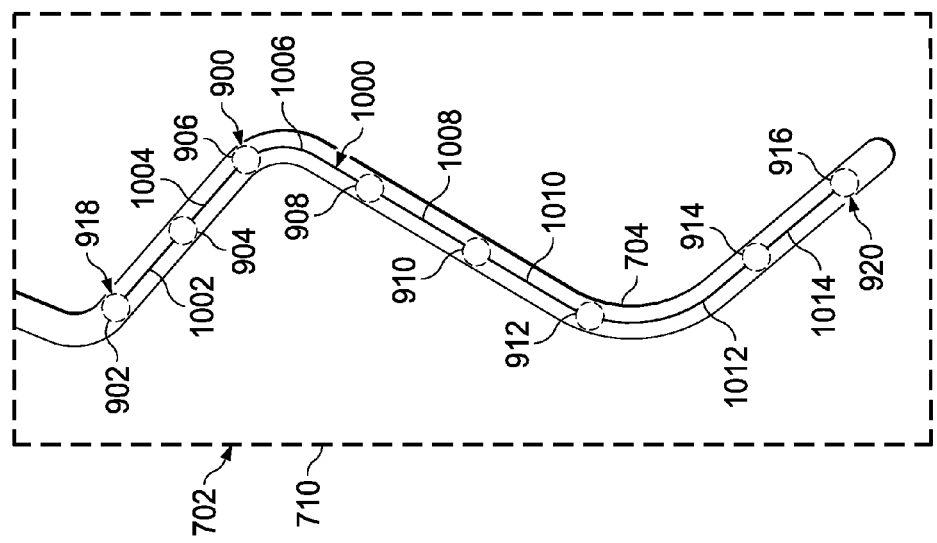
FIG. 10 is an illustration of a segment with waypoints and a trajectory in accordance with an illustrative embodiment.

In FIG. 10, an illustration of segment 704 with waypoints 900 from FIG. 10 and a trajectory is depicted in accordance with an illustrative embodiment. In this example, segment 704 in section 710 of segmented three-dimensional model 702 is shown with waypoints 900 and trajectory 1000.

Trajectory 1000 may be an example of trajectory 166 generated by coating controller 140 in FIG. 1. In this particular example, trajectory 1000 may be comprised of component 1002, 1004, 1006, 1008, 1010, 1012, and 1014.

As illustrated, component 1002 may be generated between waypoint 902 and waypoint 904, component 1004 may be generated between waypoint 904 and waypoint 906, component 1006 may be generated between waypoint 906 and waypoint 908, component 1008 may be generated between waypoint 908 and waypoint 910, component 1010 may be generated between waypoint 910 and waypoint 912, component 1012 may be generated between waypoint 912 and waypoint 914, and component 1014 may be generated between waypoint 914 and waypoint 916. Together, components 1002, 1004, 1006, 1008, 1010, 1012, and 1014 may form trajectory 1000 for use by robotic coating system 114 in FIG. 1.

In this example, coating controller 140 may generate waypoints 900 and trajectory 1000 for segment 704 of segmented three-dimensional model 702 and send one of waypoints 900 and trajectory 1000 in instructions 158 to robotic coating system 114 for further use. Robotic coating system 114 may then use trajectory 1000 to paint tube 118. In particular, robotic coating system 114 may follow trajectory 1000 to paint tube 118.

Although FIGS. 8-10 have been shown with respect to segment 704 corresponding to tube 118 in FIG. 1, other segments 152 corresponding to other objects 115 in group of objects 106 may be processed in a similar manner. Each of segments 152 may then be used to generate trajectories 164 for coating group of objects 106 in these illustrative examples.

Figure 11:
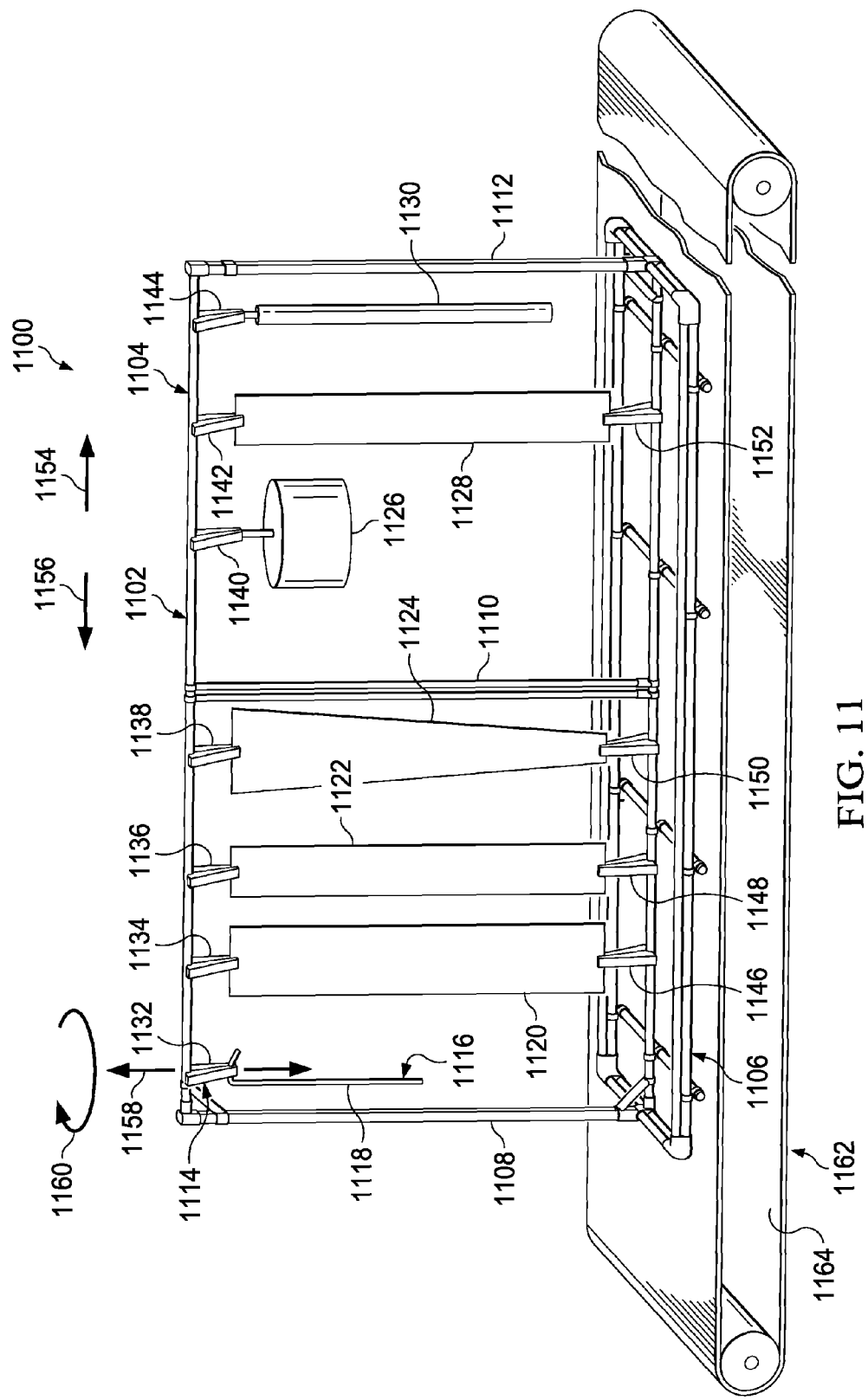
FIG. 11 is an illustration of an image of a rack with a group of objects in accordance with an illustrative embodiment.

In FIG. 11, an illustration of an image of a rack with a group of objects is depicted in accordance with an illustrative embodiment. In this example, image 1100 with rack 1102 may be one of images 146 of rack 108 with group of objects 106 shown in block form in FIG. 1. Rack 1102 also may be an alternative implementation for rack 502 shown in FIG. 5.

As depicted, rack 1102 may have upper portion 1104 and lower portion 1106 and supports 1108, 1110, and 1112. Number of fasteners 1114 may be arranged along one or both of upper portion 1104 and lower portion 1106 of rack 1102. For example, without limitation, fastener 1132, 1134, 1136, 1138, 1140, 1142, and 1144 may be arranged along upper portion 1104, while fastener 1146, 1148, 1150, and 1152 may be arranged along lower portion 1106.

As illustrated, group of objects 1116 hang from number of fasteners 1114. In particular, group of objects 1116 may include tube 1118, reservoir 1120, reservoir 1122, spar 1124, barrel 1126, panel 1128, and tube 1130 hanging from fastener 1132, 1134, 1336, 1338, 1140, 1142, and 1144, respectively. Reservoir 1120, reservoir 1122, spar 1124, and panel 1128 also may be attached to fastener 1146, 1148, 1150, and 1152, respectively.

In this depicted example, one or more of group of objects 1116 may move relative to one another. In some examples, less movement of reservoir 1120, reservoir 1122, spar 1124, and panel 1128 may occur relative to tube 1118, barrel 1126, and tube 1130 because reservoir 1120, reservoir 1122, spar 1124, and panel 1128 may be secured by two of number of fasteners 1114. For example, without limitation, reservoir 1122 may move slightly in the direction of arrow 1154 and arrow 1156, while tube 1118 hanging from fastener 1132 may have a larger range of motion such that tube 1118 may move about axis 1158 in the direction of arrow 1160.

As depicted, rack 1102 may be positioned on movement system 1162. Movement system 1162 may be conveyor belt 1164 in this example. In other illustrative examples, movement system 1162 may be a moveable platform, rails, wheels, or other suitable type of movement system configured to transport rack 1102 from one location to another location.

For example, without limitation, sensor system 504 in FIG. 5 may scan rack 1102 with group of objects 1116 and send data 124 to coating controller 140. Movement system 1162 may then move rack 1102 into a painting booth, such as painting booth 556 in FIG. 5. In painting booth 556, robotic coating system 506 in FIG. 5 may paint group of objects 1116 according to instructions 158 generated by coating controller 140 in real time.

The different components shown in FIGS. 5-11 may be illustrative examples of how components shown in block form in FIGS. 1-4 can be implemented as physical structures. Additionally, some of the components in FIGS. 5-13 may be combined with components in FIGS. 1-4, used with components in FIGS. 1-4, or a combination of the two.

Figure 12:
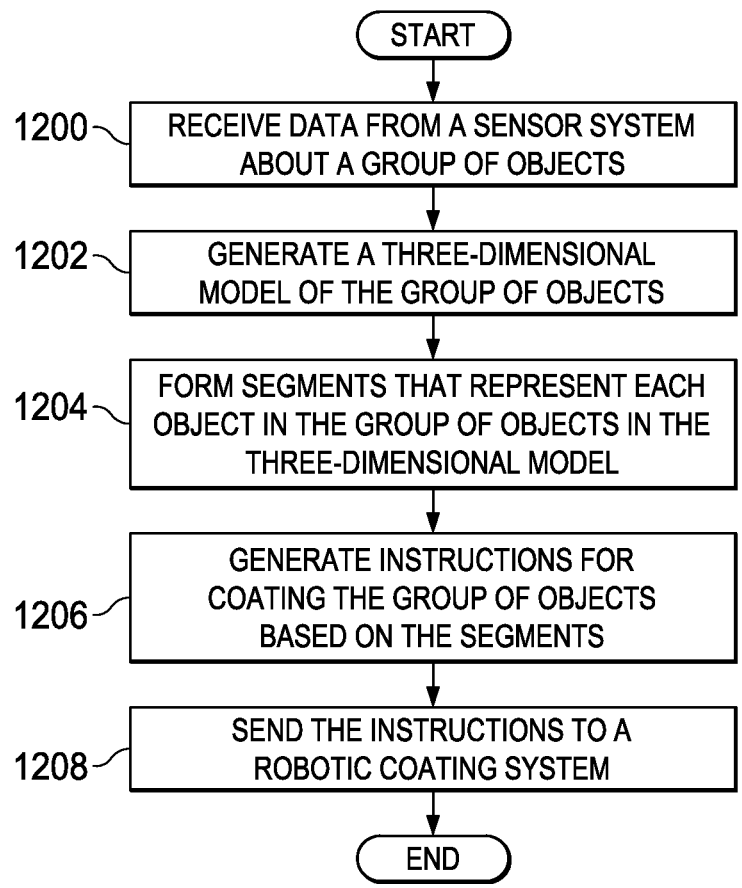
FIG. 12 is an illustration of a flowchart of a process for coating a group of objects accordance with an illustrative embodiment.

Turning next to FIG. 12, a flowchart of a process for coating group of objects 106 from FIG. 1 is depicted in accordance with an illustrative embodiment. The process shown in FIG. 12 may be implemented by coating controller 140 in computer system 112 shown in block form in FIG. 1.

The process begins by receiving data 124 from sensor system 110 about group of objects 106 (operation 1200). Next, three-dimensional model 142 of group of objects 106 may be generated (operation 1202). Three-dimensional model 142 may be point cloud 150 or may be another type of three-dimensional rendering. For example, without limitation, point cloud 150 of group of tubes 514 in FIG. 5 may be generated by coating controller 140.

The process then may form segments 152 that represent each object in group of objects 106 in three-dimensional model 142 (operation 1204). Segments 152 may represent group of objects 106 that may be coated by robotic coating system 114. For example, without limitation, coating controller 140 may form segments 152 for group of tubes 514.

Instructions 158 for coating group of objects 106 may then be generated based on segments 152 (operation 1206). In this illustrative example, instructions 158 may be configured to cause robotic coating system 114 to apply coating material 136 to group of objects 106. For example, without limitation, coating controller 140 may generate instructions 158 to cause robotic coating system 114 to paint group of tubes 514.

Next, instructions 158 may be sent to robotic coating system 114 (operation 1208), with the process terminating thereafter.

Figure 13:
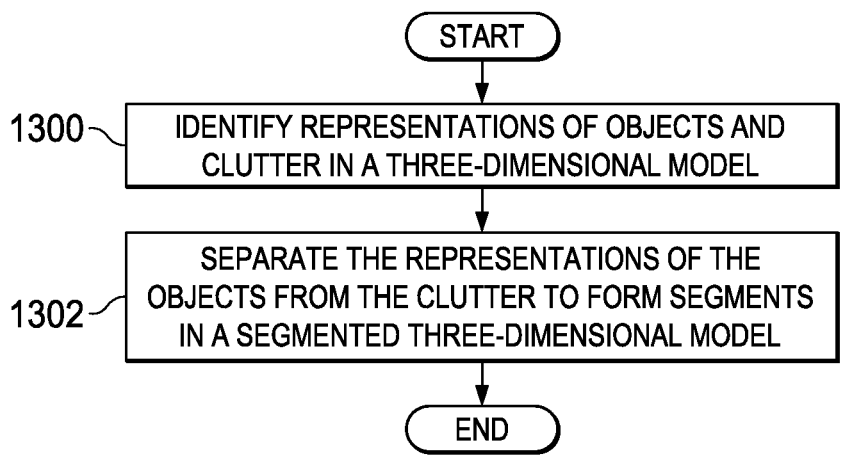
FIG. 13 is an illustration of a flowchart of a process for forming segments that represent objects in a three-dimensional model in accordance with an illustrative embodiment.

In FIG. 13, an illustration of a flowchart of a process for forming segments 152 that represent objects 115 in three-dimensional model 156 from FIG. 1 is depicted in accordance with an illustrative embodiment. The process illustrated in FIG. 13 may be implemented in operation 1204 in FIG. 12 by coating controller 140 in FIG. 1.

The process begins by identifying representations 153 of objects 115 and clutter 154 in three-dimensional model 142 (operation 1300). For example, without limitation, coating controller 140 may identify representations 153 for tube 118 in FIG. 1.

In this illustrative example, dimensions 107 of rack 108 may be known. Clutter 154 may include all data points that may not be within dimensions 107 of rack 108.

Next, representations 153 of objects 115 may be separated from clutter 154 to form segments 152 in segmented three-dimensional model 156 (operation 1302), with the process terminating thereafter. In this example, the mount positions of objects 115 may be known. The topmost point of each of objects 115 may be identified and labeled. In some examples, a nearest neighbors grouping algorithm may be run to finish the segmentation process by generating segments 152. Of course, other algorithms may be used, depending on the particular implementation. A variety of currently used segmentation techniques may be employed to generate segments 152, the details of which are omitted.

Figure 14:
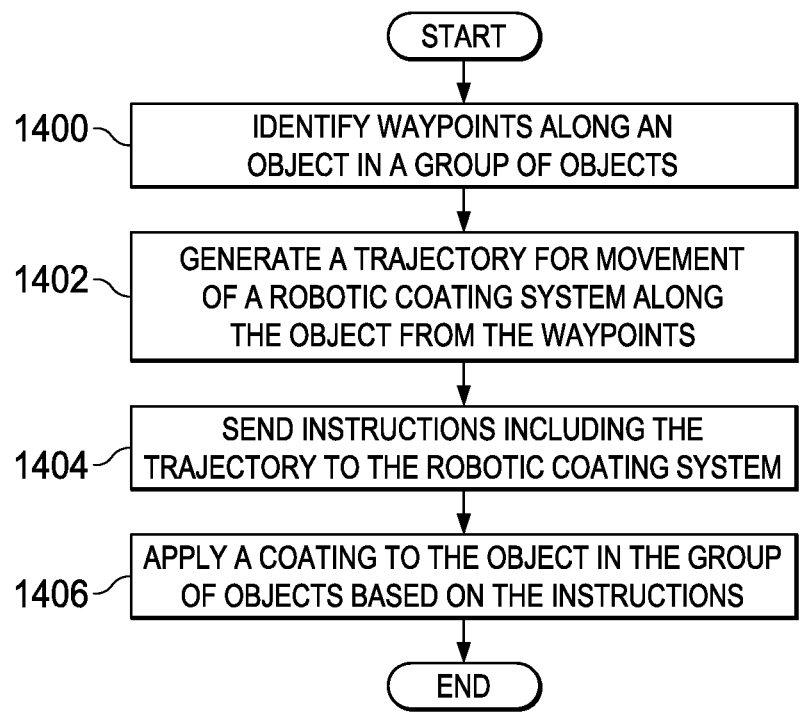
FIG. 14 is an illustration of a flowchart of a process for generating instructions for coating a group of objects in accordance with an illustrative embodiment.

With reference next to FIG. 14, an illustration of a flowchart of a process for generating instructions 158 for coating group of objects 106 from FIG. 1 is depicted in accordance with an illustrative embodiment. The process illustrated in FIG. 14 may be implemented in operation 1206 in FIG. 12 by coating controller 140 in FIG. 1.

The process begins by identifying waypoints 162 along object 116 in group of objects 106 (operation 1400). For example, without limitation, coating controller 140 may identify waypoints 162 along tube 118 in group of objects 106.

Next, trajectory 166 for movement 119 of robotic coating system 114 along object 116 may be generated from waypoints 162 (operation 1402). For example, without limitation, coating controller 140 may generate trajectory 166 for robotic coating system 114 to apply paint 138 to tube 118 from waypoints 162.

The process then may send instructions 158 including trajectory 166 to robotic coating system 114 (operation 1404). Next, robotic coating system 114 may apply coating 104 to object 116 in group of objects 106 based on instructions 158 (operation 1406), with the process terminating thereafter. For example, without limitation, robotic coating system 114 may apply paint 138 to group of tubes 514. In particular, robotic coating system 114 may apply paint 138 to tube 118. In other illustrative examples, robotic coating system 114 may apply another coating material 136 to group of objects 106, depending on the particular implementation.

Figure 15:
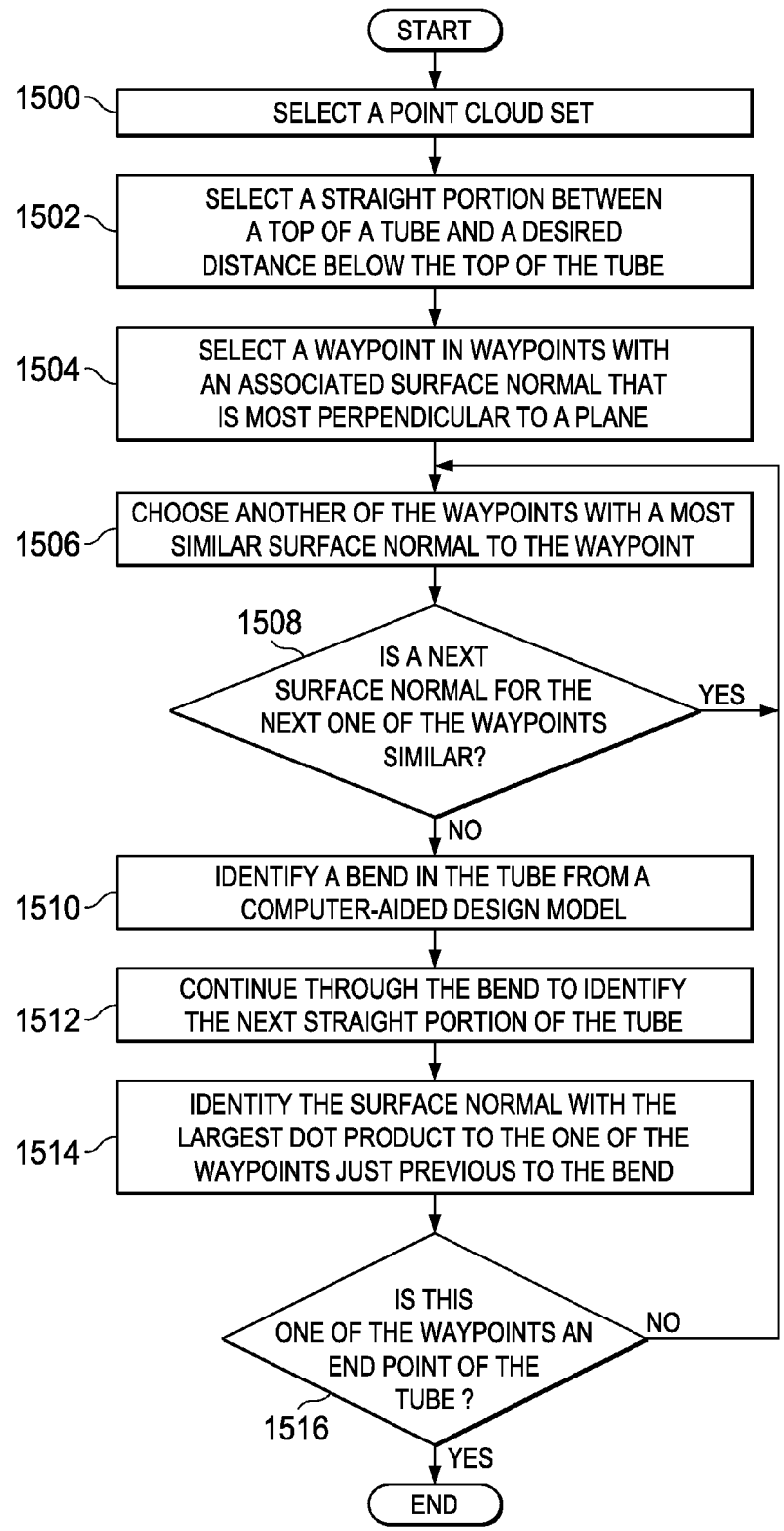
FIG. 15 is an illustration of a flowchart of a process for generating a trajectory in accordance with an illustrative embodiment.

Turning next to FIG. 15, an illustration of a flowchart of a process for generating trajectory 166 from FIG. 1 is depicted in accordance with an illustrative embodiment. In particular, this process may be implemented by coating controller 140 in FIG. 1 during operation 1402 in FIG. 14. In this figure, the process for generating six-degree-of-freedom points for robotic coating system 114 is described in detail.

The process begins by selecting point cloud set 302 (operation 1500). In this example, point cloud set 302 may include points 304 for tube 516 in FIG. 5. Waypoints 162 may be identified from points 304 for each point cloud set 302.

Next, the process selects straight portion 517 between a top of tube 516 and a desired distance below the top of tube 516 (operation 1502). Waypoint 400 in waypoints 162 is selected with an associated surface normal 308 that is most perpendicular to plane 113 (operation 1504). Plane 113 may be a y-z plane of rack 108 in FIG. 1. Waypoint 400 may be start point 402.

Another of waypoints 162 with a most similar surface normal 308 to waypoint 400 is then chosen (operation 1506). A determination may then be made as to whether next surface normal 308 for the next one of waypoints 162 is similar (operation 1508).

If surface normal 308 for the next one of waypoints 162 is similar, the process returns to operation 1506. If surface normal 308 for the next one of waypoints 162 is not similar, the process identifies bend 515 in tube 516 from computer-aided design model 144 (operation 1510). In other words, if surface normal 308 of the next one of waypoints 162 is not the same as that of the previous one of waypoints 162, the process has reached bend 515 in tube 516. No waypoints 162 in FIG. 1 may be used for the bends.

In this illustrative example, the size of bend 515 may be known from computer-aided design model 144 associated with tube 516. Computer-aided design model 144 may be an original computer-aided design model from the design of tube 516, or a computer-aided design model generated by sensor system 110 in FIG. 1.

The process then continues through bend 515 to identify the next straight portion 517 of tube 516 (operation 1512). Next, surface normal 308 with the largest dot product to the one of waypoints 162 just previous to bend 515 is identified (operation 1514).

A determination is then made as to whether this one of waypoints 162 is end point 404 of tube 516 (operation 1516). If this one of waypoints 162 is end point 404 of tube 516, the process terminates. If this one of waypoints 162 is not end point 404 of tube 516, the process returns to operation 1506, as described above.

In this manner, the process repeats operations 1506-1516 until trajectory 166 may be generated for robotic coating system 114. For example, without limitation, each of number of components 406 of trajectory 166 is generated between two of waypoints 162. In this manner, each of number of components 406 of trajectory 166 correspond to straight portions 517 of tube 516.

Illustrative embodiments of the disclosure may be described in the context of aircraft manufacturing and service method 1600 as shown in FIG. 16 and aircraft 1700 as shown in FIG. 17. In particular, coating system 102 in FIG. 1 may be implemented in various stages of aircraft manufacturing and service method 1600 to form parts for aircraft 1700.

Turning first to FIG. 16, an illustration of an aircraft manufacturing and service method is depicted in the form of a flowchart in accordance with an illustrative embodiment. During pre-production, aircraft manufacturing and service method 1600 may include specification and design 1602 of aircraft 1700 in FIG. 17 and material procurement 1604.

During production, component and subassembly manufacturing 1606 and system integration 1608 of aircraft 1700 in FIG. 17 takes place. During this stage, coating system 102 may be used to apply coating material 136 to components or assemblies for aircraft 1700.

Thereafter, aircraft 1700 in FIG. 17 may go through certification and delivery 1610 in order to be placed in service 1612. While in service 1612 by a customer, aircraft 1700 in FIG. 17 may be scheduled for routine maintenance and service 1614, which may include modification, reconfiguration, refurbishment, and other maintenance or service. One or more of the components in coating system 102 may be employed during rework to apply coating material 136 to objects in aircraft 1700.

Each of the processes of aircraft manufacturing and service method 1600 may be performed or carried out by a system integrator, a third party, and/or an operator. In these examples, the operator may be a customer. For the purposes of this description, a system integrator may include, without limitation, any number of aircraft manufacturers and major-system subcontractors; a third party may include, without limitation, any number of vendors, subcontractors, and suppliers; and an operator may be an airline, a leasing company, a military entity, a service organization, and so on.

With reference now to FIG. 17, an illustration of a block diagram of an aircraft is depicted in which an illustrative embodiment may be implemented. In this example, aircraft 1700 may be produced by aircraft manufacturing and service method 1600 in FIG. 16 and may include airframe 1702 with plurality of systems 1704 and interior 1706. Examples of systems 1704 include one or more of propulsion system 1708, electrical system 1710, hydraulic system 1712, and environmental system 1714. Any number of other systems may be included. Although an aerospace example is shown, different illustrative embodiments may be applied to other industries, such as the automotive industry.

Apparatuses and methods embodied herein may be employed during at least one of the stages of aircraft manufacturing and service method 1600 in FIG. 16. For example, without limitation, coating system 102 may be used to coat the surfaces of different aircraft components during any one of component and subassembly manufacturing 1606, system integration 1608, certification and delivery 1610, in service 1612, and maintenance and service 1614 in FIG. 16. In particular, it may be used to coat components of, for example, airframe 1702, systems 1704, and interior 1706 of aircraft 1700, among others.

In one illustrative example, components or subassemblies produced in component and subassembly manufacturing 1606 in FIG. 16 may be fabricated or manufactured in a manner similar to components or subassemblies produced while aircraft 1700 may be in service 1612 in FIG. 16. As yet another example, one or more apparatus embodiments, method embodiments, or a combination thereof may be utilized during production stages, such as component and subassembly manufacturing 1606 and system integration 1608 in FIG. 16.

One or more apparatus embodiments, method embodiments, or a combination thereof may be utilized while aircraft 1700 is in component and subassembly manufacturing 1606, system integration 1608, and maintenance and service 1614 in FIG. 16. For instance, coating system 102 may be used during component and subassembly manufacturing 1606 and system integration 1608 to apply coating material 136 to components or assemblies for aircraft 1700. During maintenance and service 1614, coating system 102 may be used to coat components that need to be reworked for upgrades, refurbishment, or other operations that may be performed during maintenance and service 1614. The use of a number of the different illustrative embodiments may substantially expedite the assembly and maintenance of and/or reduce the cost of aircraft 1700.

Figure 18:
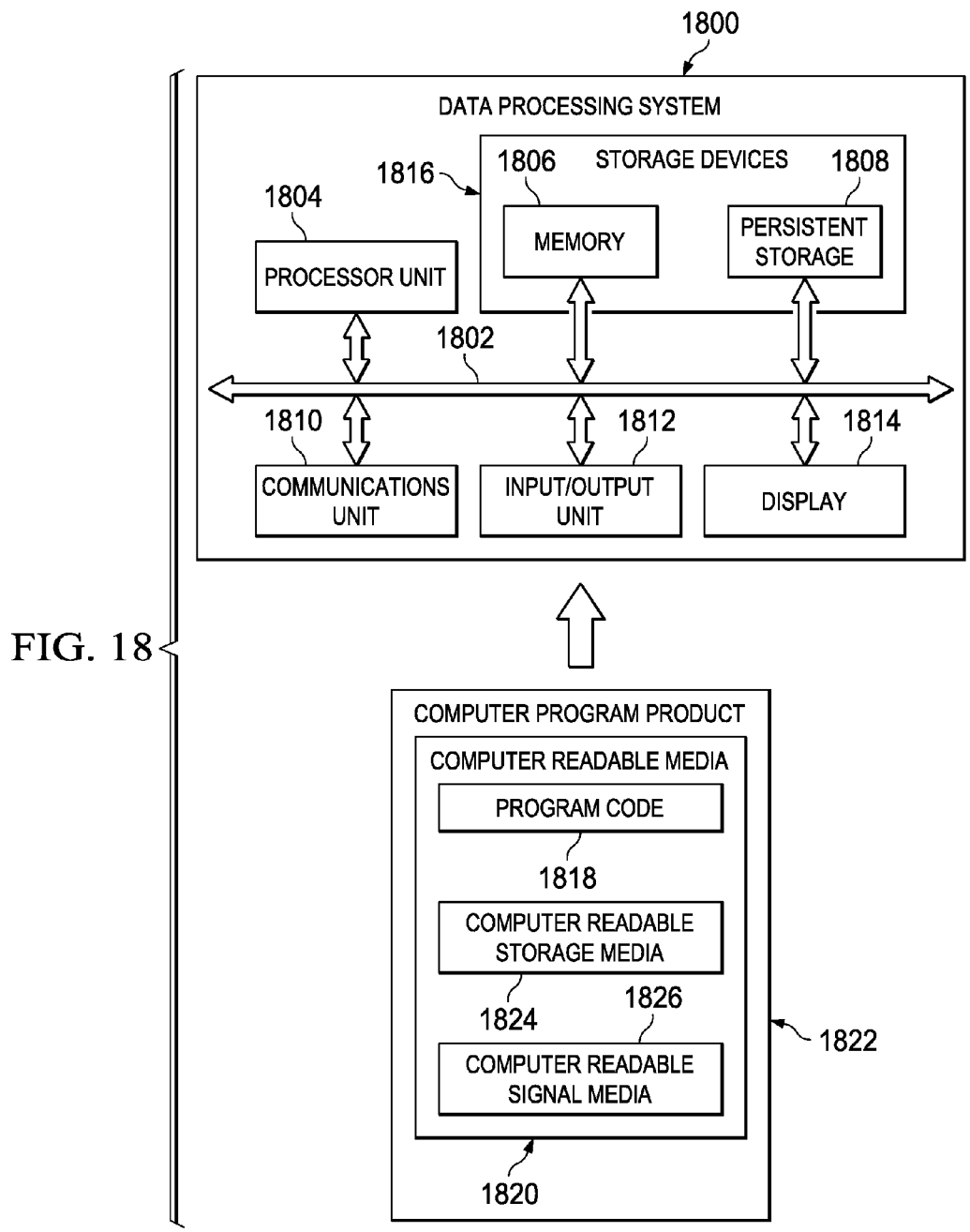
FIG. 18 is an illustration of a block diagram of a data processing system in accordance with an illustrative embodiment.

Turning now to FIG. 18, an illustration of a block diagram of a data processing system is depicted in accordance with an illustrative embodiment. Data processing system 1800 may be used to implement coating controller 140 in computer system 112 in FIG. 1.

In this illustrative example, data processing system 1800 includes communications framework 1802, which provides communications between processor unit 1804, memory 1806, persistent storage 1808, communications unit 1810, input/output (I/O) unit 1812, and display 1814. In this example, communication framework may take the form of a bus system.

Processor unit 1804 serves to execute instructions for software that may be loaded into memory 1806. Processor unit 1804 may be a number of processors, a multi-processor core, or some other type of processor, depending on the particular implementation.

Memory 1806 and persistent storage 1808 may be examples of storage devices 1816. A storage device may be any piece of hardware that may be capable of storing information, such as, for example, without limitation, without limitation, data, program code in functional form, and/or other suitable information either on a temporary basis and/or a permanent basis. Storage devices 1816 may also be referred to as computer readable storage devices in these illustrative examples. Memory 1806, in these examples, may be, for example, without limitation, a random access memory or any other suitable volatile or non-volatile storage device. Persistent storage 1808 may take various forms, depending on the particular implementation.

For example, without limitation, persistent storage 1808 may contain one or more components or devices. For example, without limitation, persistent storage 1808 may be a hard drive, a flash memory, a rewritable optical disk, a rewritable magnetic tape, or some combination of the above. The media used by persistent storage 1808 also may be removable. For example, without limitation, a removable hard drive may be used for persistent storage 1808.

Communications unit 1810, in these illustrative examples, provides for communications with other data processing systems or devices. In these illustrative examples, communications unit 1810 may be a network interface card.

Input/output unit 1812 allows for input and output of data with other devices that may be connected to data processing system 1800. For example, without limitation, input/output unit 1812 may provide a connection for user input through a keyboard, a mouse, and/or some other suitable input device. Further, input/output unit 1812 may send output to a printer. Display 1814 provides a mechanism to display information to a user.

Instructions for the operating system, applications, and/or programs may be located in storage devices 1816, which may be in communication with processor unit 1804 through communications framework 1802. The processes of the different embodiments may be performed by processor unit 1804 using computer-implemented instructions, which may be located in a memory, such as memory 1806.

These instructions may be referred to as program code, computer usable program code, or computer readable program code that may be read and executed by a processor in processor unit 1804. The program code in the different embodiments may be embodied on different physical or computer readable storage media, such as memory 1806 or persistent storage 1808.

Program code 1818 may be located in a functional form on computer readable media 1820 that may be selectively removable and may be loaded onto or transferred to data processing system 1800 for execution by processor unit 1804. Program code 1818 and computer readable media 1820 form computer program product 1822 in these illustrative examples. In one example, computer readable media 1820 may be computer readable storage media 1824 or computer readable signal media 1826.

In these illustrative examples, computer readable storage media 1824 may be a physical or tangible storage device used to store program code 1818 rather than a medium that propagates or transmits program code 1818.

Alternatively, program code 1818 may be transferred to data processing system 1800 using computer readable signal media 1826. Computer readable signal media 1826 may be, for example, without limitation, a propagated data signal containing program code 1818. For example, without limitation, computer readable signal media 1826 may be an electromagnetic signal, an optical signal, and/or any other suitable type of signal. These signals may be transmitted over communications links, such as wireless communications links, optical fiber cable, coaxial cable, a wire, and/or any other suitable type of communications link.

The different components illustrated for data processing system 1800 are not meant to provide architectural limitations to the manner in which different embodiments may be implemented. The different illustrative embodiments may be implemented in a data processing system including components in addition to and/or in place of those illustrated for data processing system 1800. Other components shown in FIG. 18 can be varied from the illustrative examples shown. The different embodiments may be implemented using any hardware device or system capable of running program code 1818.

The flowcharts and block diagrams in the different depicted embodiments illustrate the architecture, functionality, and operation of some possible implementations of apparatuses and methods in an illustrative embodiment. In this regard, each block in the flowcharts or block diagrams may represent a module, a segment, a function, and/or a portion of an operation or step.

In some alternative implementations of an illustrative embodiment, the function or functions noted in the blocks may occur out of the order noted in the figures. For example, without limitation, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

Thus, one or more illustrative embodiments provide a method and apparatus for coating an object using a robotic object coating system. In one illustrative embodiment, a coating controller may be configured to generate a three-dimensional model of a group of objects and form segments from the group of objects in the three-dimensional model. The coating controller may be further configured to generate instructions for coating the group of objects based on the segments. These instructions may be configured to cause a robotic coating system to coat the group of objects.

In the illustrative examples, a sensor system provides real-time input to the coating controller. The sensor system may be operated automatically or by a human operator prior to the coating process. In this manner, the coating system may provide real time information regarding the orientation of each of the objects in the group of objects to be coated. The process may be automated and may not expose human operators to undesirable conditions. Accordingly, the process of coating groups of objects may be completed more efficiently, accurately, and safely than with some currently used systems.

The description of the different illustrative embodiments has been presented for purposes of illustration and description, and is not intended to be exhaustive or limited to the embodiments in the form disclosed. Many modifications and variations will be apparent to those of ordinary skill in the art. Further, different illustrative embodiments may provide different features as compared to other illustrative embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

What is claimed is:

1. A method for coating an object, the method comprising:
   generating a three-dimensional model of the object;
   forming a segment that represents the object in the three-dimensional model; and
   generating instructions for coating the object based on the segment, in which the instructions are configured to cause a robotic coating system to coat the object, wherein generating instructions comprises:
   identifying a plurality of waypoints along the object;
   determining a plurality of surface normals, wherein each surface normal in the plurality of surface normals is calculated at a corresponding waypoint in the plurality of waypoints; and
   generating a trajectory for movement of the robotic coating system along the object based on the plurality of waypoints and the plurality of surface normals.

2. The method of claim 1, wherein the three-dimensional model is generated in real time.

3. The method of claim 1, further comprising:
   operating the robotic coating system to apply a coating to the object using the instructions.

4. The method of claim 3, wherein the coating is selected from one of a paint, an adhesive, a sealant, a lubricant, a wear resistant coating, a corrosion resistant coating, and a scratch resistant coating.

5. The method of claim 1, wherein generating the three-dimensional model of the object comprises:
generating data about the object using a sensor system; and
generating the three-dimensional model of the object from the data generated by the sensor system.

6. The method of claim 5, wherein the sensor system is selected from one of a camera system or a laser scanner.

7. The method of claim 5, wherein the data is selected from at least one of images or three-dimensional coordinates for a surface of the object.

8. The method of claim 5, wherein the sensor system comprises a depth sensor.

9. The method of claim 5, wherein the sensor system is attached to the robotic coating system.

10. The method of claim 1, wherein the three-dimensional model is selected from one of a point cloud and a computer-aided design model.

11. The method of claim 1, wherein forming the segment that represents the object in the three-dimensional model comprises:
identifying representations of the object and clutter in the three-dimensional model; and
separating the representations of the object from the clutter to form the segment in a segmented three-dimensional model.

12. The method of claim 1, wherein the object is selected from one of an aircraft part, a tube, a spar, a reservoir, a stringer, a panel, or a barrel.

13. The method of claim 1, wherein generating instructions further comprises:
selecting a first straight portion between a top of the object and a first desired distance below the top of the object;
selecting a first surface normal in the plurality of surface normals at a first location on the first straight portion, wherein the first surface normal is perpendicular to a plane corresponding to a shape of a rack to which the object is attached;
selecting a first waypoint in the plurality of waypoints at the first location;
selecting a second surface normal in the plurality of surface normals at a second location, wherein the second surface normal is substantially similar in direction to the first surface normal; and
selecting a second waypoint in the plurality of waypoints at the second location.

14. The method of claim 13, wherein generating instructions further comprises:
selecting a third waypoint in the plurality of waypoints at a third location along a bend in the object.

15. The method of claim 14, wherein generating instructions further comprises:
selecting a second straight portion between the bend in the object and a second desired distance below the bend in the object;
calculating a plurality of dot products between the plurality of surface normals and the plurality of waypoints;
selecting a third surface normal in the plurality of surface normals at a fourth location, wherein the third surface normal has a dot product with a magnitude that is the largest in the plurality of dot products;
selecting a fourth waypoint in the plurality of waypoints at the fourth location;
selecting a fourth surface normal in the plurality of surface normals at a fifth location, wherein the fourth surface normal is substantially similar in direction to the third surface normal; and
selecting a fifth waypoint in the plurality of waypoints at the fifth location.

16. The method of claim 15, further comprising:
determining whether the fifth waypoint is an end point of the object.

17. The method of claim 16, further comprising:
terminating the method upon a determination that the fifth waypoint is the end point.

18. A method for painting a tube, the method comprising:
generating a three-dimensional model of the tube;
forming a segment that represents the tube in the three-dimensional model; and
generating instructions for painting the tube based on the segment, in which the instructions are configured to cause a robotic painting system to paint the tube, wherein generating instructions comprises:
identifying a plurality of waypoints along the tube;
determining a plurality of surface normals, wherein each surface normal in the plurality of surface normals is calculated at a corresponding waypoint in the plurality of waypoints; and
generating a trajectory for painting along the tube based on the plurality of waypoints and the plurality of surface normals.

19. The method of claim 18, further comprising:
operating the robotic painting system to apply paint to the tube using the instructions.

20. A method for coating an object, the method comprising:
generating a three-dimensional model of the object comprising at least one of an aircraft part, a tube, a spar, a reservoir, a stringer, panel, or a barrel, in which the three-dimensional model is generated in real time and selected from one of a point cloud and a computer-aided design model, and in which generating the three-dimensional model of the object comprises:
generating data about the object using a sensor system attached to a robotic coating system, in which the sensor system is selected from one of a camera system or a laser scanner and comprises a depth sensor, and in which the data is selected from at least one of images or three-dimensional coordinates for a surface of the object; and
generating the three-dimensional model of the object from the data generated by the sensor system;
forming a segment that represents the object in the three-dimensional model, in which forming the segment comprises:
identifying clutter in the three-dimensional model; and
separating the object from the clutter to form a segmented three-dimensional model;
generating instructions for coating the object based on the segment, wherein the instructions are configured to cause a robotic coating system to coat the object and comprise a plurality of waypoints and a trajectory, and wherein generating the instructions comprises:
identifying the plurality of waypoints along the object;
determining a plurality of surface normals, wherein each surface normal in the plurality of surface normals is calculated at a corresponding waypoint in the plurality of waypoints; and generating the trajectory for movement of the robotic coating system along the object from the plurality of waypoints and the plurality of surface normals; and operating the robotic coating system to apply a coating to the object using the instructions, in which the coating is selected from one of a paint, an adhesive, a sealant, a lubricant, a wear resistant coating, a corrosion resistant coating, and a scratch resistant coating.

21. A method for painting a tube, the method comprising:

generating a three-dimensional model of the tube;

forming a segment that represents the tube in the three-dimensional model;

generating instructions for painting the tube based on the segment, wherein the instructions are configured to cause a robotic painting system to paint the tube, and wherein generating the instructions comprises:

selecting a plurality of waypoints along the tube;

determining a plurality of surface normals, wherein each surface normal in the plurality of surface normals is calculated at a corresponding waypoint in the plurality of waypoints; and generating a trajectory for movement of the robotic painting system along the tube based on the plurality of waypoints and the plurality of surface normals; and operating the robotic painting system to apply paint to the tube using the instructions.

\* \* \* \* \*